United States Patent
Hirler et al.

(10) Patent No.: US 9,418,851 B2
(45) Date of Patent: Aug. 16, 2016

(54) METHOD FOR MANUFACTURING A SEMICONDUCTOR DEVICE

(71) Applicant: Infineon Technologies Austria AG, Villach (AT)

(72) Inventors: Franz Hirler, Isen (DE); Roman Knoefler, Villach (AT); Anton Mauder, Kolbermoor (DE); Hans Weber, Bayerisch-Gmain (DE); Joachim Weyers, Hoehenkirchen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/068,749

(22) Filed: Mar. 14, 2016

(65) Prior Publication Data
US 2016/0197142 A1    Jul. 7, 2016

Related U.S. Application Data

(62) Division of application No. 14/145,166, filed on Dec. 31, 2013, now Pat. No. 9,293,528.

(51) Int. Cl.
*H01L 21/266* (2006.01)

(52) U.S. Cl.
CPC .................... *H01L 21/266* (2013.01)

(58) Field of Classification Search
CPC ................ H01L 29/0646; H01L 21/266
See application file for complete search history.

(56) References Cited

U.S. PATENT DOCUMENTS

| | | | | |
|---|---|---|---|---|
| 6,551,909 B1* | 4/2003 | Fujihira | .............. | H01L 29/0619 257/E21.383 |
| 6,724,042 B2* | 4/2004 | Onishi | ................ | H01L 29/0634 257/339 |
| 7,002,205 B2 | 2/2006 | Onishi et al. | | |
| 7,417,284 B2* | 8/2008 | Yamauchi | ........... | H01L 29/0615 257/341 |
| 9,209,292 B2 | 12/2015 | Schulze et al. | | |
| 2005/0045922 A1* | 3/2005 | Ahlers | ................ | H01L 27/0883 257/242 |

(Continued)

FOREIGN PATENT DOCUMENTS

DE    10066053 B4    3/2006

OTHER PUBLICATIONS

Schulze, Hans-Joachim et al., "Charge Compensation Semiconductor Devices", U.S. Appl. No. 13/945,226, filed Jul 18, 2013.

*Primary Examiner* — Lex Malsawma
(74) *Attorney, Agent, or Firm* — Murphy, Bilak & Homiller, PLLC

(57) ABSTRACT

A wafer includes a semiconductor layer having a concentration of n-dopants. A first mask is formed on the wafer and has first openings in an active area of a semiconductor device and at least one second opening in a peripheral area of the device. The first openings define first zones in the semiconductor layer and each second opening defines a second zone in the layer. Donor ions are implanted through the first mask into the first and second zones. The first mask is replaced by a second mask which has third openings in the active area and at least one fourth opening in the peripheral area. Each fourth opening defines a fourth zone in the semiconductor layer which at least partially overlaps with the second zone. The third openings define third zones in the semiconductor layer. Acceptor ions are implanted through the second mask into the third and fourth zones.

10 Claims, 14 Drawing Sheets

(56) References Cited

U.S. PATENT DOCUMENTS

| | | | |
|---|---|---|---|
| 2005/0077572 A1* | 4/2005 | Yamauchi | H01L 29/0619 257/341 |
| 2007/0138543 A1 | 6/2007 | Saito | |
| 2007/0272979 A1 | 11/2007 | Saito et al. | |
| 2008/0315297 A1 | 12/2008 | Takashita et al. | |
| 2009/0267174 A1* | 10/2009 | Willmeroth | H01L 29/0634 257/493 |
| 2010/0032791 A1 | 2/2010 | Hozumi et al. | |
| 2010/0059818 A1 | 3/2010 | Sasaki | |
| 2010/0078775 A1* | 4/2010 | Mauder | H01L 29/0615 257/655 |
| 2012/0126315 A1 | 5/2012 | Onishi et al. | |

* cited by examiner

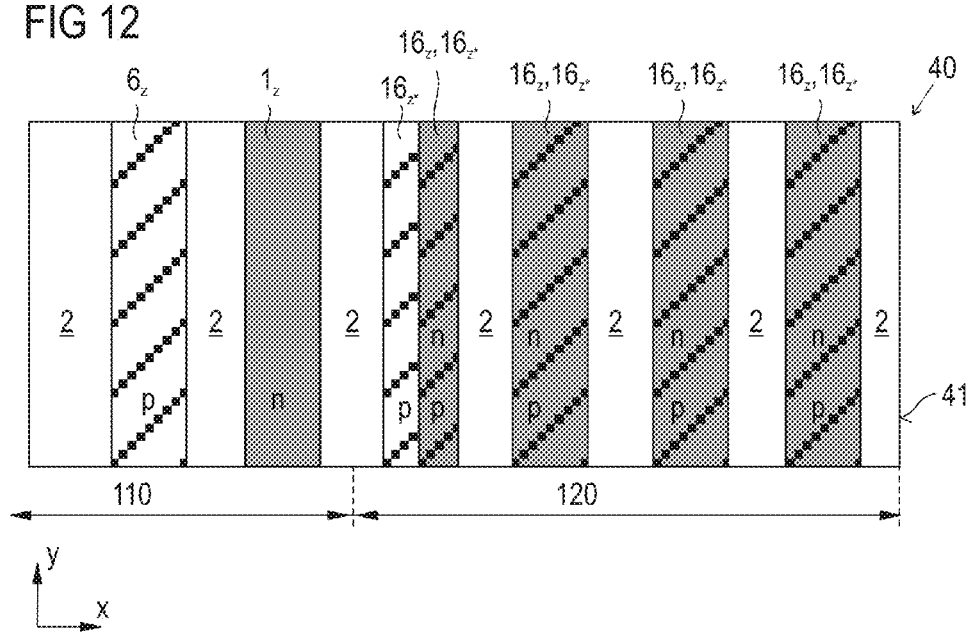
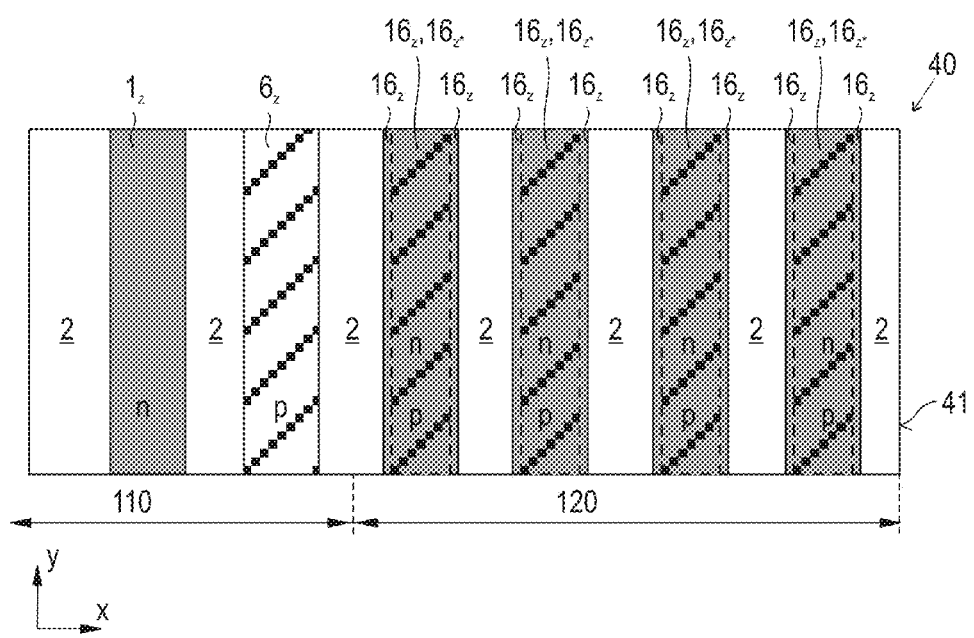

METHOD FOR MANUFACTURING A SEMICONDUCTOR DEVICE

TECHNICAL FIELD

Embodiments of the present invention relate to field-effect semiconductor devices having a charge compensation structure and manufacturing methods therefor, in particular to power semiconductor devices having in an active area a charge compensation structure.

BACKGROUND

Semiconductor transistors, in particular field-effect controlled switching devices such as a Metal Oxide Semiconductor Field Effect Transistor (MOSFET) or an Insulated Gate Bipolar Transistor (IGBT), have been used for various applications including but not limited to use as switches in power supplies and power converters, electric cars, air-conditioners, and even stereo systems. Particularly with regard to power devices capable of switching large currents and/or operating at higher voltages, low on-state resistance Ron, high breakdown voltages $U_{bd}$, high robustness and/or good softness are often desired.

To achieve low on-state resistance Ron and high breakdown voltages $U_{bd}$, compensation semiconductor devices were developed. The compensation principle is based on a mutual compensation of charges in n- and p-doped regions, which are often also referred to as n- and p-doped pillar regions, in the drift zone of a vertical MOSFET.

Typically, the charge compensation structure formed by p-type and n-type regions is arranged below the actual MOSFET-structure, with its source, body regions and gate regions, and also below the associated MOS-channels that are arranged next to one another in the semiconductor volume of the semiconductor device or interleaved with one another in such a way that, in the off-state, their charges can be mutually depleted and that, in the activated state or on-state, there results an uninterrupted, low-impedance conduction path from a source electrode near the surface to a drain electrode arranged on the back side.

By virtue of the compensation of the p-type and n-type dopings, the doping of the current-carrying region can be significantly increased in the case of compensation components, which results in a significant reduction of the on-state resistance Ron despite the loss of a current-carrying area. The reduction of the on-state resistance Ron of such semiconductor power devices is associated with a reduction of the heat generated by the current in the on-state, so that such semiconductor power devices with charge compensation structure remain "cool" compared with conventional semiconductor power devices.

Meanwhile, switching losses of power semiconductor devices have become more important. Depending on device operation, output charge $Q_{OSS}$ (or output capacitance $C_{OSS}$) and switching losses $E_{OSS}$, respectively, stored in the space charge region formed in the off-state and during reverse bias, respectively, mainly determine the switching losses. The stored charge $Q_{OSS}$ of semiconductor devices with charge compensation structures may be comparatively high. This may result in significant switching losses $E_{OSS}$ when significant parts of the stored charge $Q_{oss}$ are removed at high voltages across load terminals of the power semiconductor device. In addition, the output charge $Q_{OSS}$ has to be removed to enable blocking. This results in switching delays.

To achieve high breakdown voltages $U_{bd}$, an edge-termination structure may be used in a peripheral area surrounding the active area with active MOSFET-cells. However, the peripheral area requires chip area and thus increases costs. Further, the edge-termination structure and the peripheral area, respectively, may substantially contribute to the output charge $Q_{OSS}$ and the output capacitance $C_{OSS}$, respectively, for example to more than 10% of the total output capacitance $C_{OSS}$. Furthermore, the alternating n- and p-doped pillar regions of the charge-compensation structure are typically formed as elongated strips when seen from above. Accordingly, the portions of the peripheral area which are arranged, in elongation direction of the alternating n- and p-doped pillar regions, between the active area and the lateral device edge may have a comparatively high share of the total output charge $Q_{OSS}$. Even further, charge imbalances introduced into the peripheral area during manufacturing may increase the output charge $Q_{OSS}$ and the output capacitance $C_{OSS}$, respectively.

Accordingly, there is a need to improve semiconductor devices with charge compensation structures and manufacturing of those semiconductor devices.

SUMMARY

According to an embodiment of a field-effect semiconductor device, the field-effect semiconductor device includes a semiconductor body including a first surface, an edge delimiting the semiconductor body in a direction substantially parallel to the first surface, an active area, and a peripheral area arranged between the active area and the edge, a source metallization arranged on the first surface, and a drain metallization opposite to the source metallization. In the peripheral area the semiconductor body includes a low-doped semiconductor region having a first average concentration of dopants of a first conductivity type. In a vertical cross-section substantially orthogonal to the first surface, the semiconductor body further includes: a plurality of pillar regions of the first conductivity type alternating with pillar regions of a second conductivity type in the active area, and at least one auxiliary pillar region arranged in the peripheral area. The pillar regions of the first conductivity type are in Ohmic contact with the drain metallization. The pillar regions of the second conductivity type are in Ohmic contact with the source metallization. The at least one auxiliary pillar region includes dopants of the first conductivity type and dopants of the second conductivity type. An average concentration of the dopants of the first conductivity type of the at least one auxiliary pillar region is larger than the first average concentration.

According to an embodiment of a power semiconductor device, the power semiconductor device includes a semiconductor body having a first surface. The semiconductor body includes an active area including n-type semiconductor regions and p-type semiconductor regions. The n-type semiconductor regions alternate, in a direction substantially parallel to the first surface, with the p-type semiconductor regions. The semiconductor body includes a peripheral area surrounding the active area. The peripheral area includes a low-doped semiconductor region having a first concentration of n-dopants lower than a doping concentration of n-dopants of the n-type semiconductor regions, and at least one auxiliary semiconductor region having a concentration of n-dopants higher than the first concentration and a concentration of p-dopants higher than the first concentration.

According to an embodiment of a method for manufacturing a semiconductor device, the method includes: providing a wafer having an upper side and including a semiconductor layer having a first concentration of n-dopants; forming a first mask on the upper side, the first mask has, in a cross-section substantially orthogonal to the upper side, first openings in an active area of a semiconductor device and at least one second opening in a peripheral area of the semiconductor device, the first openings defining first zones in the semiconductor layer and the at least one second opening defining a second zone in the semiconductor layer; implanting donor ions of a first maximum energy through the first mask into the first zones and the second zone; replacing the first masked by a second mask having, in the cross-section, third openings in the active area of the semiconductor device and at least one fourth opening in the peripheral area of the semiconductor device, the at least one fourth opening defining a fourth zone in the semiconductor layer which at least partially overlaps with the second zone, the third openings defining third zones in the semiconductor layer; and implanting acceptor ions of a second maximum energy through the second mask into the third zones and the fourth zone.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 12 illustrates a horizontal cross-section through a semiconductor body during method steps of a method according to embodiments;

FIG. 13 illustrates a horizontal cross-section through a semiconductor body during method steps of a method according to embodiments;

DETAILED DESCRIPTION

Figure 1:
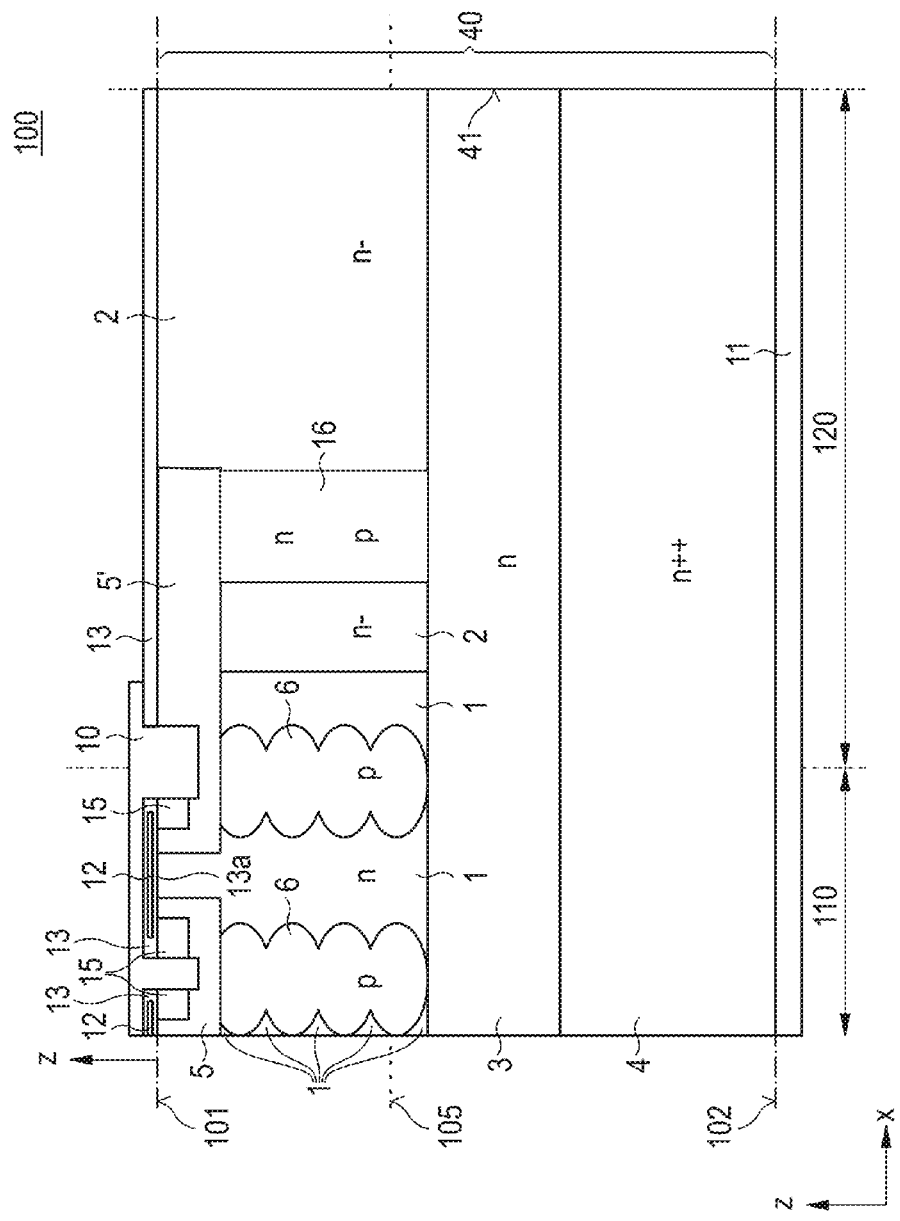
FIG. 1 illustrates a vertical cross-section through a semiconductor body of a semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main horizontal surface of a semiconductor substrate or body. This can be for instance the surface of a wafer or a die.

The term "vertical" as used in this specification intends to describe an orientation which is substantially arranged perpendicular to the first surface, i.e. parallel to the normal direction of the first surface of the semiconductor substrate or body. Likewise, the term "horizontal" as used in this specification intends to describe an orientation which is substantially arranged parallel to the first surface.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "n$^-$" means a doping concentration which is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to field-effect semiconductor devices, in particular to field-effect compensation semiconductor devices and manufacturing methods therefor. Within this specification the terms "semiconductor device" and "semiconductor component" are used synonymously. The field-effect semiconductor device is typically a vertical semiconductor device such as a vertical MOSFET with a source metallization and an insulated gate electrode arranged on the first surface and a drain metallization arranged on a second surface arranged opposite to the first surface. Typically, the field-effect semiconductor device is a power semiconductor device having an active area with a plurality of MOSFET-cells for carrying and/or controlling a load current. Furthermore, the power semiconductor device has typically a peripheral area with at least one edge-termination structure at least partially surrounding the active area when seen from above.

The term "power semiconductor device" as used in this specification intends to describe a semiconductor device on a single chip with high voltage and/or high current switching capabilities. In other words, power semiconductor devices are intended for high current, typically in the Ampere range and/or voltages of more than about 10 V or even more than about 100 V or about 500 V. Within this specification the terms "power semiconductor device" and "power semiconductor component" are used synonymously.

The term "edge-termination structure" as used in this specification intends to describe a structure that provides a transition region in which the high electric fields around an active area of the semiconductor device change gradually to the potential at or close to the edge of the device and/or between a reference potential such as ground and a high voltage e.g. at the edge and/or backside of the semiconductor device. The edge-termination structure may, for example, lower the field intensity around a termination region of a rectifying junction by spreading the electric field lines across the termination region.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are in low Ohmic contact with a drain electrode (drain metallization). The source region is in low Ohmic contact with a source electrode (source metallization). In the context of the present specification, the term "in Ohmic contact" intends to describe that there is a low-ohmic ohmic current path between respective elements or portions of a semiconductor device when no voltages or only small probe voltages are applied to and/or across the semiconductor device. Within this specification the terms "in Ohmic contact", "in resistive electric contact", "electrically coupled", and "in resistive electric connection" are used synonymously.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e.g. metal, alloys, doped polycrystalline semiconductors and metal semiconductor compounds like metal silicides.

In the context of the present specification, the term "gate electrode" intends to describe an electrode which is situated next to, and insulated from the body region and configured to form and/or control a channel region through the body region.

In the context of the present specification, the term "field electrode" intends to describe an electrode which is arranged next to a semiconductor region, typically the drift region, partially insulated from the semiconductor region, and configured to expand a depleted portion in the semiconductor region by charging to an appropriate voltage, typically a negative voltage with regard to the surrounding semiconductor region for an n-type semiconductor region.

In the context of the present specification, the term "mesa" or "mesa region" intends to describe a semiconductor region between two adjacent trenches extending into the semiconductor substrate or body in a vertical cross-section.

The term "commutating" as used in this specification intends to describe the switching of the current of a semiconductor device from a conducting direction in which a pn-load junction, for example the pn-junction between the body region and the drift region of a MOSFET, is forwardly biased to the opposite direction or blocking direction in which the pn-load junction is reversely biased. The term "hard commutating" as used in this specification intends to describe commutating with a speed of at least about $10^9$ V/s, more typically with a speed of at least about $5*10^9$ V/s.

In the following, embodiments pertaining to semiconductor devices and manufacturing methods for forming semiconductor devices are explained mainly with reference to silicon (Si) semiconductor devices. Accordingly, a monocrystalline semiconductor region or layer is typically a monocrystalline Si-region or Si-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band gap material such as SiC or GaN which has a high breakdown field strength and high critical avalanche field strength, respectively, the doping of the respective semiconductor regions can be chosen higher which reduces the on-state resistance Ron in the following also referred to as on-resistance Ron.

With reference to FIG. 1, a first embodiment of a semiconductor device 100 is explained. FIG. 1 illustrates a vertical cross-section through a semiconductor body 40 of the semiconductor device 100. The semiconductor body 40 extends between a first surface 101, facing a vertical direction z, and a second surface 102 arranged opposite to the first surface 101. In a horizontal direction x that is substantially parallel to the first surface 101, the semiconductor body 40 is delimited by an edge 41, for example a sawing edge, which is substantially orthogonal to the first surface 101. The semiconductor body 40 has an active area 110 and a peripheral area 120 arranged between the active area 110 and the edge 41. Typically, the peripheral area 120 surrounds the active area 110 when seen from above.

A source metallization 10 is arranged on the first surface 101. A drain metallization 11 is arranged on the second surface 102, i.e. opposite to the source metallization 10. Furthermore, a gate electrode 12 is typically also arranged on the first surface 101 and insulated from the source metallization 10 and the semiconductor body 40 by a dielectric region 13. The gate electrode 12 is connected to a gate metallization that is not shown in FIG. 1. Accordingly, the semiconductor device 100 may be operated as a three-terminal device.

The semiconductor body 40 typically includes a bulk mono-crystalline material 4 and at least one epitaxial layer 3, 2, 1 formed thereon. Using the epitaxial layer(s) 3, 2, 1 provides more freedom in tailoring the background doping of the material since the doping concentration can be adjusted during deposition of the epitaxial layer or layers.

In the exemplary embodiment illustrated in FIG. 1, the semiconductor body 40 includes a highly doped n-type drain region 4 that extends to the second surface 102 and is in Ohmic contact with the drain metallization 11 and with an n-type field-stop region 3 that adjoins the drain region 4 and has a lower maximum doping concentration than the drain region 4. The drain region 4 and the optional field-stop region 3 are typically arranged in the active area 110 and the peripheral area 120 and may extend to the edge 41.

In the active area 110, a plurality of alternating n-type drift portions 1 and p-type compensation regions 6 forming respective pn-junctions with each other are arranged. The drift portions 1 have a first maximum doping concentration, which is typically higher than the maximum doping concentration of the field-stop region 3. The drift portions 1 are in Ohmic contact with the drain metallization 11 (in the exemplary embodiment via the adjoining field-stop region 3 and the drain region 4), and typically extend to the first surface 101. For sake of clarity, only three drift portions 1 and two compensation regions 6 are illustrated in FIG. 1. In the following, the n-type drift portions 1 are also referred to as n-type semiconductor regions 1 and pillar regions 1 of the first conductivity type, respectively, and the p-type compensation regions 6 are also referred to as p-type semiconductor regions 6 and pillar regions 6 of the second conductivity type, respectively.

An (mathematically) integrated dopant concentration of the drift portions 1 substantially matches an integrated dopant concentration of the compensation regions 6. Accordingly, the drift portions 1 and the compensation regions 6 form a pn-compensation structure 1, 6. The mean dopant concentration of the drift portions 1 and compensation regions 6, i.e., the mathematically integrated difference of the donor concentration and the acceptor concentration per volume, is typically lower than the maximum doping concentration of the field-stop region 3, more typically lower than the mean doping concentration of the field-stop region 3. Even more typically, the mean dopant concentration of the drift portions 1 and compensation regions 6 is below 10% or below 5% of the maximum dopant concentration of the drift portions 1 and/or the compensation regions 6. Even more typically, the mean dopant concentration of the drift portions 1 and compensation regions 6 is substantially zero.

In the exemplary embodiment, the p-type compensation regions 6 are formed as vertically orientated pillars. Alternatively, the p-type compensation regions 6 are formed as substantially vertically orientated strip-type parallelepipeds, rectangles or ellipsoids.

Depending on the manufacturing of the pn-compensation structure 1, 6, the dopant concentration may vary in the drift portions 1 and/or compensation regions 6.

The compensation regions 6 are in Ohmic contact with the source metallization 10 via body regions 5, 5'.

Figure 2:
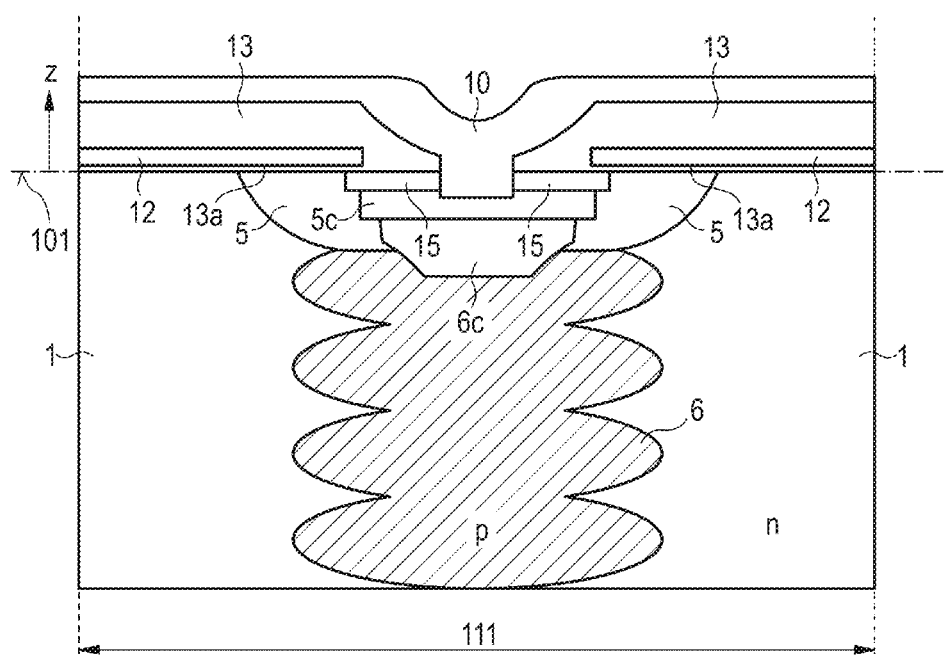
FIG. 2 illustrates a section of the vertical cross-section through the semiconductor device illustrated in FIG. 1 according to an embodiment.

This is explained in more detail with regard to FIG. 2 illustrating an enlarged upper section of the semiconductor device 100 illustrated in FIG. 1. The illustrated section of FIG. 2 typically corresponds to an upper part of one of a plurality of unit cells 111 in the active area 110 of the semiconductor device 100.

In the exemplary embodiment, a $p^+$-type body contact region 5c and two $n^+$-type source regions 15 are formed in a p-type body region 5. Further, an optional $p^+$-type contact region 6c extends between the body contact region 5c and the compensation region 6. The body contact region(s) 5c and the contact region(s) 6c are not shown in FIG. 1 and the following Figures for sake of clarity.

A portion 13a of the dielectric region 13 is arranged between the first surface 101 and each of the gate electrodes 12, and extends in a horizontal direction from the drift portion 1 along the body region 5 at least to the source region 15 so that an inversion channel, which is also referred to herein as MOS-channel, may be formed by the field-effect in a channel region of the body region 5 along the portion(s) 13a forming a gate dielectric region. Accordingly, the semiconductor device 100 may be operated as a MOSFET.

The remaining portion of the dielectric region 13 forms an interlayer dielectric between the source metallization 10 and gate electrode 12 and first surface 101, respectively.

In the exemplary embodiment, the source metallization 10 is electrically contacted with the source regions 15 and the body contact region 5c via a shallow trench contact formed through the interlayer dielectric 13 and into the semiconductor body 40. In other embodiments, the source metallization 10 electrically contacts the source region 15 and the body contact region 5c substantially at the first surface 101.

According to another embodiment, the gate electrode(s) 12 and gate dielectric(s) 13a are formed in a respective trench extending from the first surface 101 into the semiconductor body 40. In this embodiment, the body region 5 and source regions 15 adjoin an upper part of the respective trench while the drift portions 1 adjoin a lower part of the respective trench. In this embodiment, the drift portions 1 may not extend to the first surface 101 in the active area 110. Referring again to FIG. 1, further embodiments are explained.

According to an embodiment, the doping concentrations of the p-type compensation regions 6 and the drift portions 1 are chosen such that, in the off-state, their charges can be mutually depleted and that, in the on-state, an uninterrupted, low-resistive conduction path is formed from the source metallization 10 to the drain metallization 11.

As illustrated in FIG. 1, the interlayer dielectric 13 typically also covers the semiconductor body 40 in the peripheral area 120. The interlayer dielectric 13 may substantially extend to the edge 41.

In the exemplary embodiment, the drift portion 1 that is closest to the edge 41 does not contribute or does not significantly contribute to the forward current of the MOSFET 100 and is therefore not attributed to the active area 110. The active area 110 may be defined by the presence of source regions 15 and insulated gate electrodes 12 configured to form and/or change a channel region. The active area 110 may also be defined by the presence of active cells, typically MOSFET-cells, for carrying a load current between the source metallization 10 and the drain metallization 11.

According to an embodiment, the semiconductor body 40 further includes a low-doped semiconductor region 2, which is in Ohmic contact with the drift portions 1 and which has a concentration of n-type dopants (donors) lower than a doping concentration (donor concentration) of the drift portions 1 and typically also lower than a doping concentration (donor concentration) of the field-stop region 3. The concentration of n-type dopants of the low-doped semiconductor region 2 is in the following also referred to as first doping concentration.

If not specified, the term doping concentration of a semiconductor region or semiconductor layer when used in comparison with a doping concentration of another semiconductor region or semiconductor may also refer to a maximum concentration and/or a mean or average concentration of dopants of the respective semiconductor region or semiconductor layer. Within the semiconductor region or semiconductor layer, the doping concentration may vary.

The doping concentration of the low-doped semiconductor region 2 is typically lower than the doping concentration of the drift portions 1 by at least a factor of five, more typically by at least a factor of about ten, even more typically by a factor of at least about 20, even more typically by a factor of at least about 50, for example by a factor of about 100.

Typically, there are substantially no acceptors (p-type dopants) in the low-doped semiconductor region 2. Further, the doping concentration of donors (n-type dopants) of the low-doped semiconductor region 2 typically depends on the voltage class of the semiconductor device. For example, the maximum doping concentration of donors of the low-doped semiconductor region 2 may be in a range from about $2*10^{13}$ cm$^{-3}$ to about $2*10^{14}$ cm$^{-3}$ for a semiconductor device 100 with rated blocking voltage of 600 V.

The maximum doping concentration (of donors) of the low-doped semiconductor region 2 may substantially correspond to the average doping concentration (of donors) of the low-doped semiconductor region 2 and is typically lower than about $10^{15}$ cm$^{-3}$, more typically lower than about $5*10^{14}$ cm$^{-3}$ or even lower than about $10^{14}$ cm$^{-3}$, i.e. the low-doped semiconductor region 2 may be a substantially intrinsic semiconductor region with a doping concentration in a range from about $10^{13}$ cm$^{-3}$ to about $10^{14}$ cm$^{-3}$.

The low-doped semiconductor region 2 may be an n-type semiconductor region and may form a pn-junction with a body region 5' closest to the edge 41.

Further, the low-doped semiconductor region 2 may extend to the first surface 101 and/or the edge 41 in the peripheral area 120.

According to an embodiment, an auxiliary pillar region 16 doped both with n-type dopants (donors) and p-type dopants (acceptors) is arranged in the peripheral area 120. A concentration of the donors of the auxiliary pillar region 16 is larger than the first average concentration the low-doped semiconductor region 2. This is due to the manufacturing methods for the semiconductor device 100 which is explained in detail below with regard to FIG. 9 to FIG. 17.

In a nutshell, the alternating drift portions 1 and compensation regions 6 of the active area 110 are typically manufactured by implanting donors and acceptors through respective masks into an intrinsic or weakly n-doped epitaxial semiconductor layer (low-doped semiconductor layer) 2 and subsequent thermal annealing. According to an embodiment the masks for implanting donors (donor ions) and acceptors (acceptor ions) into the active area 110 have one (or more) common openings in the peripheral area 120 to implant donors and acceptors into one (or more) substantially common zone(s) for forming the auxiliary pillar region(s) 16. Accordingly, at least the average effective doping of the auxiliary pillar region(s) 16 is substantially not changed. More particular, the total amount of additionally implanted donors of the auxiliary pillar region(s) 16 substantially matches the total amount of additionally implanted acceptors of the auxiliary pillar region(s) 16. Due to adding substantially the same amount of donors and acceptors to the auxiliary pillar region(s) 16, the difference between the average concentration of donors and the average concentration of acceptors of the auxiliary pillar region(s) 16 substantially matches the first average concentration. Since the first average concentration is typically at least one order of magnitude lower, more typically at least two orders of magnitude, the average concentration of donors and the average concentration of acceptors of the auxiliary pillar region(s) 16 may substantially match.

Due to the common opening(s) of the two implantation masks in the peripheral area 120, the CD-variations (critical dimension variations) and the CD-offset, respectively, of the mask openings for the drift portion 1 and compensation region 6 closest to the edge 41 (most right drift portion 1 and compensation region 6 in FIG. 1) is reduced. Thus, the variation of the charge balance in the outermost semiconductor regions 1, 6 that may cause reduction the breakdown voltage is reduced. Note that the mask opening closest to the edge may have an offset, a widening and/or tapered walls due to lithographic effects (proximity effects, shrinkage of the photoresist, mechanical stress etc.). Those mask variations may still occur in the peripheral area 120 of semiconductor device 100 for the common mask opening(s) of the auxiliary pillar region(s) 16. However, the resulting charge imbalance may be lower due to using common openings for the donor and acceptor implantations of the auxiliary pillar region(s) 16 since any stress effects in the photoresist affects the donor and acceptor implantations in a symmetric way. Further, any charge imbalance occurring in the peripheral area 120, i.e. in a device area with reduced electric field strength during the blocking mode, has a substantially reduced influence on the blocking voltage. This also facilitates design of additional edge-termination structures (not shown in FIG. 1) arranged in the peripheral area 120.

Numerical simulations show that already one auxiliary pillar region 16 is sufficient to compensate with regard to the blocking voltage CD-variations up to at least about 0.5 μm.

Figure 3:
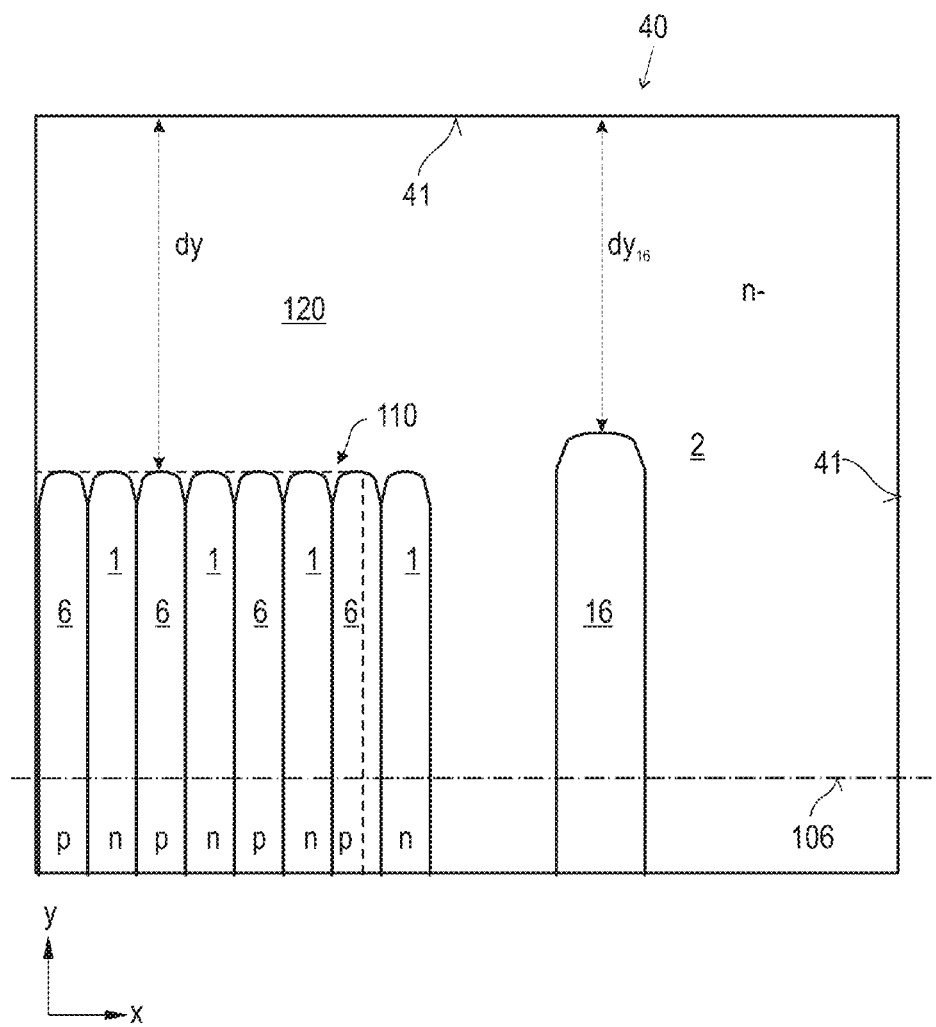
FIG. 3 illustrates a horizontal cross-section through a semiconductor body of the semiconductor device illustrated in FIG. 1 according to an embodiment.

FIG. 3 illustrates an edge portion of a horizontal cross-section 105 through the semiconductor body 40 of the semiconductor device 100 illustrated in FIG. 1. FIG. 1 typically corresponds to a vertical cross-section along line 106 in FIG. 2.

According to an embodiment, the active area 110 of semiconductor device 100 includes drift portions 1 (n-type semiconductor regions) and compensation regions 6 (p-type semiconductor regions) which alternate in a horizontal direction with each other. The peripheral area 120 surrounds the active area 110 and includes a low-doped semiconductor region 2 having a first concentration of n-dopants lower than a doping concentration of n-dopants of the drift portions 1, and at least one auxiliary semiconductor region 16 having a doping concentration of n-dopants (donor concentration) higher than the first concentration and a concentration of p-dopants (acceptor concentration) substantially equal to or lower than a doping concentration of p-dopants of compensation regions 6.

In the exemplary embodiment illustrated in FIG. 1, the drift portions 1, compensation regions 6 and the auxiliary pillar region 16 are in the horizontal cross-section and when seen from above, formed as parallel orientated elongated bars or strips.

Typically, the distance $dy_{16}$ in elongation direction y of the drift portions 1, the compensation regions 6 and the auxiliary pillar region 16, respectively, between the edge 41 and the auxiliary pillar region 16 is equal to, more typically smaller than the distance dy in the elongation direction y between the edge 41 and the drift portions 1 and the compensation regions 6, respectively. Accordingly, the CD-variations and the CD-offset, respectively, of the mask openings of the implantation masks for the drift portions 1 and compensation regions 6 may be avoided in all vertical cross-sections 106 crossing the drift portions 1 and compensation regions 6.

In the exemplary embodiment illustrated in FIG. 1 to FIG. 3, there is no source region 15 and no insulated gate electrode 12 provided between the compensation region 6 and the drift portion 1 closest to the auxiliary pillar region 16 and closest to the edge 41 in x-direction, respectively. Accordingly, the outermost drift portion 1 does not contribute to the forward current of semiconductor device 100 and thus not considered as part of the active area 110. This is, however, only an example.

In the exemplary embodiment illustrated in FIG. 1, the auxiliary pillar region 16 is arranged between two portions of a contiguous low-conductive semiconductor region 2.

Figure 4:
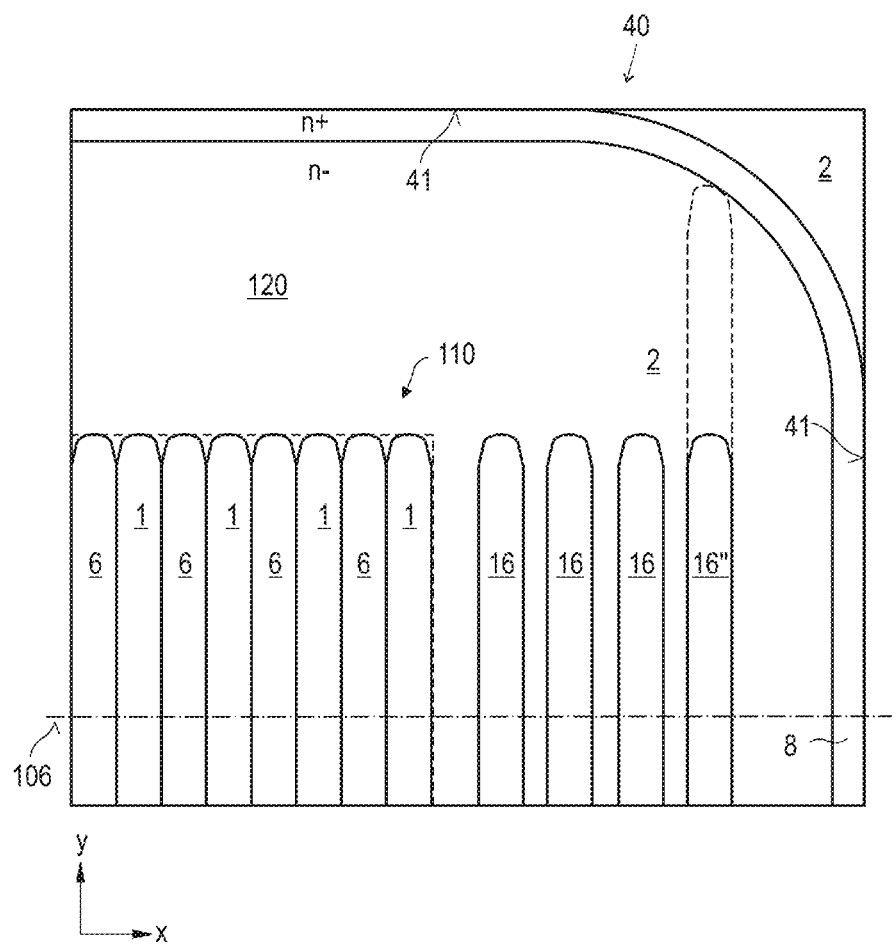
FIG. 4 illustrates a horizontal cross-section through a semiconductor body of a semiconductor device according to an embodiment.

FIG. 4 illustrates a horizontal cross-section through a semiconductor body 40 of a semiconductor device 200. The semiconductor device 200 is similar to the semiconductor device 100 explained above with regard to FIGS. 1 to 3. However, the semiconductor body 40 of the semiconductor device 200 further includes an n-type channel-stop region 8 adjoining the low-doped semiconductor region 2 and having a doping concentration that is higher than the first doping concentration of the second semiconductor region 2. Typically, the channel-stop region 8 extends to the first surface (101). Further, the channel-stop region 8 typically surrounds the active area 110 when seen from above. The channel-stop region 8 may at least in portions extend substantially to the edge 41.

Due to the channel-stop region 8, the electric field in the off-state does not, or at least almost does not, extend to the edge 41. Accordingly, a low leakage current is ensured, as crystal defects which may be caused by sawing are shielded by the highly doped channel-stop region 8.

Further, the semiconductor body 40 of the semiconductor device 200 includes several auxiliary pillar regions 16, 16". At least the outermost auxiliary pillar regions 16" is arranged in a region of low electric field strength during blocking mode, i.e. in a region of the peripheral area 120 where the electric field during the blocking mode is lower by a factor of at least about ten, more typically by a factor of at least about 100 compared the active area 110. Accordingly, charge imbalance due the manufacturing (CD-variations and subsequent implantations) are at most expected for the outermost auxiliary pillar regions 16' exposed to low electric fields only and thus at most of minor importance for the blocking behavior of the semiconductor device 200. For the same reason the distance between the outermost auxiliary pillar regions 16" and the channel-stop region 8 in x-direction may be small or even vanish. Furthermore, the auxiliary pillar regions 16, 16" may extend in y-direction close to or even to the channel-stop region 8 as indicated by the dashed extension of the outermost auxiliary pillar regions 16" in FIG. 4.

Figure 5:
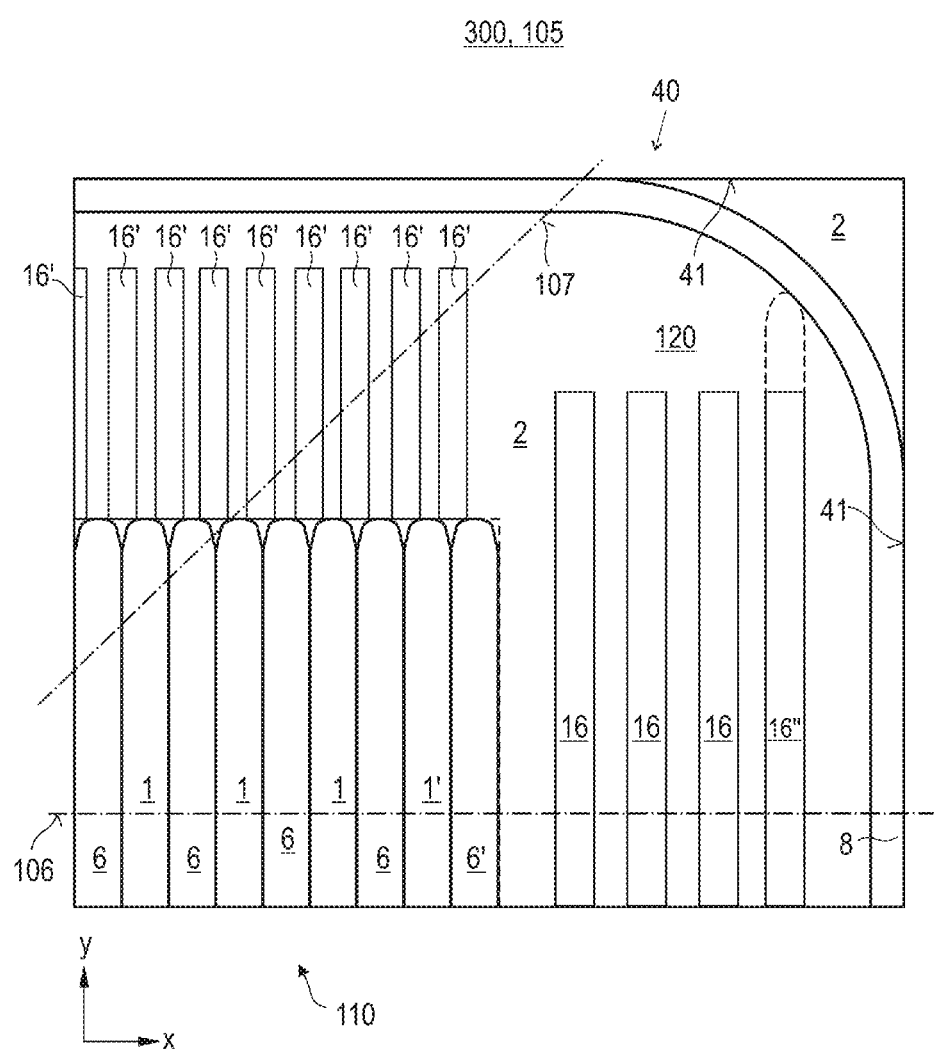
FIG. 5 illustrates a horizontal cross-section through a semiconductor body of a semiconductor device according to an embodiment.

FIG. 5 illustrates a horizontal cross-section through a semiconductor body 40 of a semiconductor device 300. The semiconductor device 300 is similar to the semiconductor device 200 explained above with regard to FIG. 4. However, the semiconductor body 40 further includes a further n-type pillar region 1' having a lower doping concentration than the drift portions 1 (n-type pillar regions) and adjoining the outermost compensation region 6 (p-type pillar region), and a further p-type pillar region 6' having a lower doping concentration than the compensation regions 6 and adjoining the further n-type pillar region 1'. Due to the reduced doping of the further n-type pillar region 1' and the further p-type pillar region 6', the potential drop across the further n-type pillar region 1' and the further p-type pillar region 6' is also lower during the off-state (blocking mode). In the following, the n-type pillar region 1, the p-type pillar regions 6, the n-type pillar region 1', and the n-type pillar region 6' are also referred to as first n-type pillar region 1, first p-type pillar region 6, second n-type pillar region 1' and second p-type pillar region 6', respectively.

In the exemplary embodiment illustrated in FIG. 5, the semiconductor body 40 of the semiconductor device 300 further includes further auxiliary pillar region 16' which are substantially strip-shaped when seen from above and in the horizontal cross-section 105, respectively. Each of the further auxiliary pillar regions 16' extends in y-direction (elongation direction) from the active area 110 into the peripheral area 120, typically close to or even to the channel-stop region 8.

In the exemplary embodiment illustrated in FIG. 5, each of the further auxiliary pillar regions 16' adjoins a pair of adjoining drift portions 1 and compensation regions 6 and the pair of further pillar regions 1', 6', respectively.

Typically, the active area 120 is surrounded by auxiliary pillar regions 16, 16', 16" when seen from above and in horizontal cross-sections, respectively. Accordingly, a peripheral area 120 with a particularly low output charge $Q_{OSS}$ may be provided.

Typically, there are at least two, more typically a plurality, intersecting vertical cross-sections 106, 107 through the semiconductor body 40 in which a plurality of n-type pillar regions 1 (drift portions) alternate with p-type pillar regions 6 (compensation regions) in the active area 110, and in which at least one auxiliary pillar region 16, 16', 16" is arranged in the peripheral area 120. The two vertical cross-sections 106, 107 may intersect in a vertical center line of the semiconductor device 300 and/or an angle between the two vertical cross-sections 106, 107 may be larger than about 45°. The two vertical cross-sections 106, 107 may even be perpendicular.

As explained above with regard to FIG. 1 to FIG. 3, auxiliary pillar regions 16, 16', 16" are typically manufactured using implantation masks for implanting donor ions and acceptor ions having common openings for the auxiliary pillar regions 16, 16', 16". Any variation of the width of the common mask openings for implanting donors and acceptors may substantially compensate each other with regard to any undesired doping imbalance. Further, compared to other edge terminations the output charge $Q_{OSS}$ in the peripheral area 120 may only be a small fraction using common mask openings for multiple implantations. Accordingly, the lateral electric field (horizontal component) during the blocking mode is at most small. Even further, due to a similar vertical doping profile in the active area 110 and the auxiliary pillar regions 16, 16', 16", the electric field distribution during the blocking mode in the auxiliary pillar regions 16, 16', 16" and the peripheral area 120, respectively, may be more homogeneous and more favorable compared to the typically triangular vertical electric field distribution of an intrinsic or nearly intrinsic low-doped semiconductor region 2 without the auxiliary pillar regions 16, 16', 16". For example, an upper portion of the auxiliary pillar regions 16, 16', 16" may have an excess of acceptors and a lower portion of the auxiliary pillar regions 16, 16', 16" may have an excess of donors while the auxiliary pillar regions 16, 16', 16" are on average substantially compensated. This typically results in a peripheral area 120 which is also in y-direction electrically compensated or at least substantially compensated and has also a low gradient of dopant concentration in y-direction. Accordingly, the output charge $Q_{OSS}$ is substantially reduced and the breakdown behavior stabilized.

Figure 6:
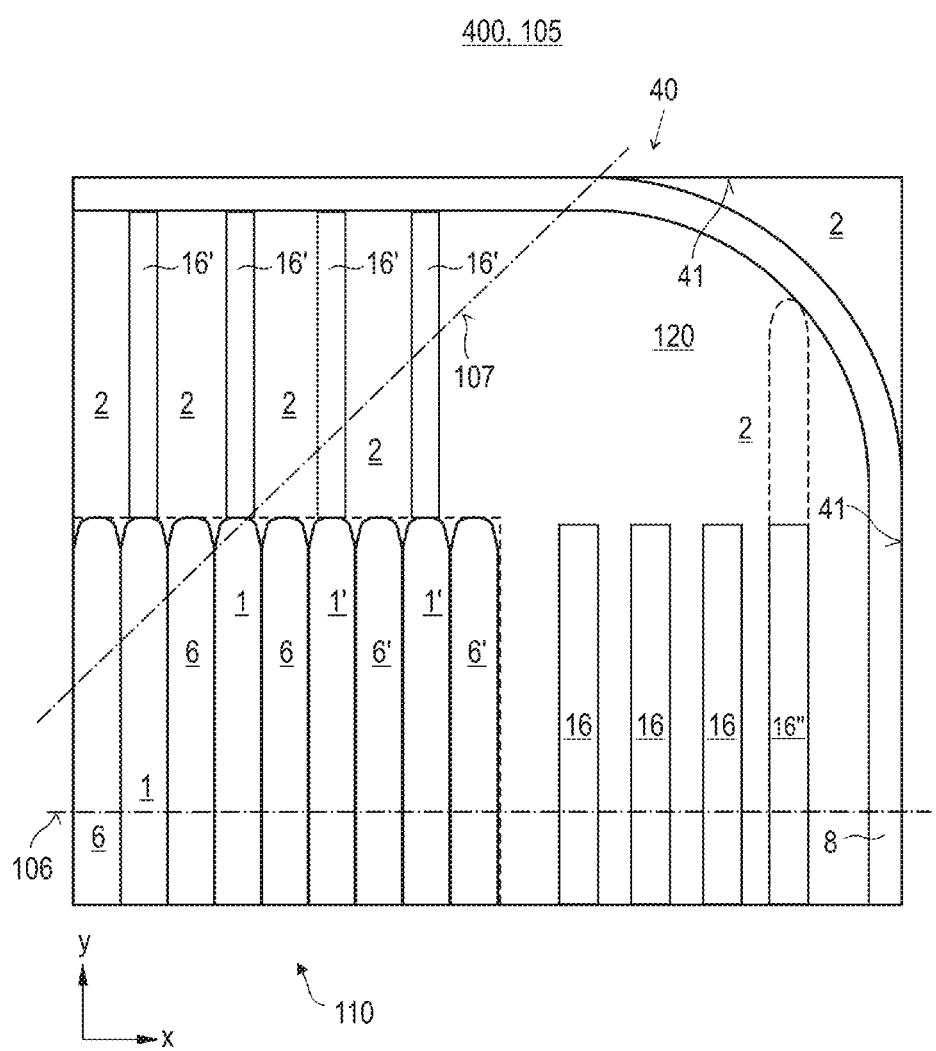
FIG. 6 illustrates a horizontal cross-section through a semiconductor body of a semiconductor device according to an embodiment.

FIG. 6 illustrates a horizontal cross-section through a semiconductor body 40 of a semiconductor device 400. The semiconductor device 400 is similar to the semiconductor device 300 explained above with regard to FIG. 5. In the exemplary embodiment illustrated in FIG. 6, the semiconductor body 40 includes two pairs of further pillar regions 1', 6'. Further, each of the further auxiliary pillar regions 16' extends between one of the drift portions 1 and the channel-stop region 8 and one of the further n-type pillar region 1' and the channel-stop region 8, respectively.

Figure 7:
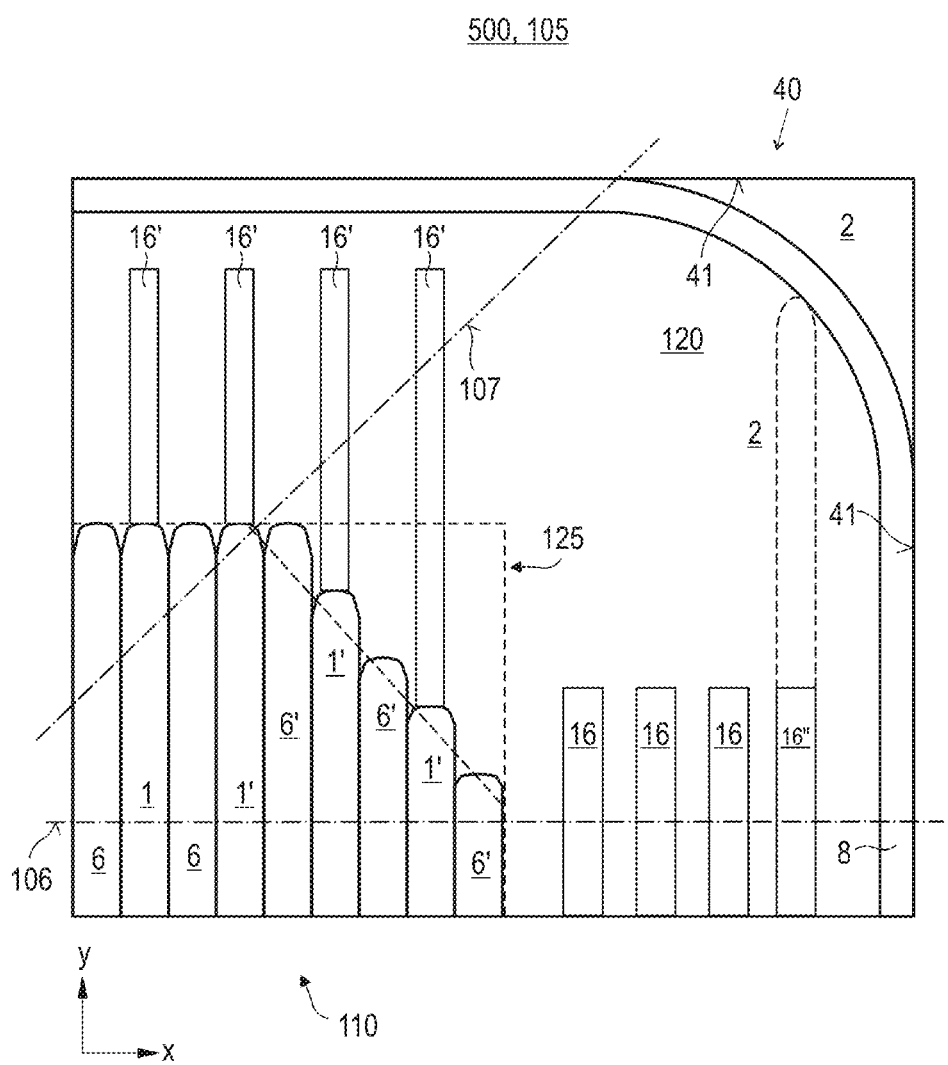
FIG. 7 illustrates a horizontal cross-section through a semiconductor body of a semiconductor device according to an embodiment.

FIG. 7 illustrates a horizontal cross-section through a semiconductor body 40 of a semiconductor device 500. The semiconductor device 500 is similar to the semiconductor device 400 explained above with regard to FIG. 6. In the exemplary embodiment illustrated in FIG. 7, the extensions in y-direction of the drift portions 1 and compensation regions 6 are reduced and the extensions of the adjoining further auxiliary pillar regions 16" increased with reduced distance in x-direction from the edge 41 in a transitional region 125 between the active area 110 and the peripheral area 120 and next to an edge line between two substantially orthogonal edges 41 of the semiconductor body 40. This facilitates reducing the output charge $Q_{OSS}$.

Further, the semiconductor body 40 includes three pairs of further pillar regions 1', 6'. Typically, the number of pairs of further pillar regions 1', 6' is in a range from 1 to 8 or even to 15 but may also be larger.

Figure 8:
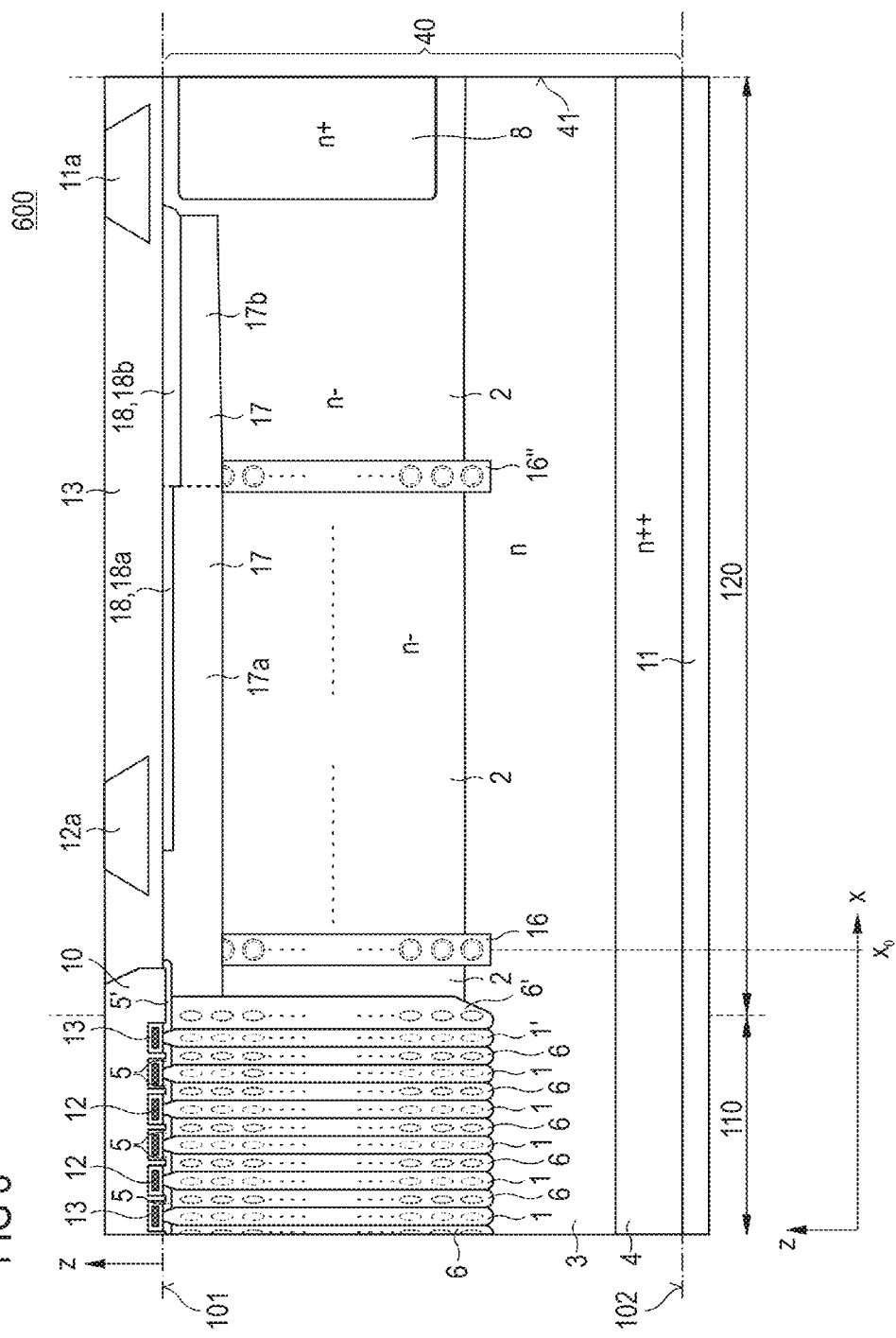
FIG. 8 illustrates a vertical cross-section through a semiconductor body of a semiconductor device according to an embodiment.

FIG. 8 illustrates a vertical cross-section through a field-effect semiconductor device 600. The active area 110 of the field-effect semiconductor device 500 is similar to the active area of the semiconductor device 100 explained above with regard to FIGS. 1 to 3 and also includes a compensation structure formed by a plurality of alternating first n-type pillar regions (drift portions) 1 and first p-type pillar regions (compensation regions) 6. The first p-type pillar regions 6 are in Ohmic contact with the source metallization 10 and the first n-type pillar regions 1 are in Ohmic contact with the drain metallization 11 arranged opposite. An integrated dopant concentration of the first n-type pillar regions 1 substantially matches an integrated dopant concentration of the first p-type pillar regions 6. The dashed-dotted ellipses within the first n-type pillar regions 1 and dashed ellipses within the first p-type pillar regions 6 indicate optional sub-regions having a higher n-type dopant concentration and a higher p-type dopant concentration, respectively.

However, the semiconductor body 40 of the semiconductor device 500 further includes a second p-type pillar region 6' in Ohmic contact with the source metallization 10 and a second n-type pillar region 1' that is arranged between and forms respective pn-junctions with the second p-type pillar region 6' and the outermost first p-type pillar regions 6. The dashed-dotted ellipses within the second n-type pillar regions 1' and the dashed ellipses within the second p-type pillar regions 6' indicate optional sub-regions having a higher n-type dopant concentration and a higher p-type dopant concentration, respectively. The second p-type pillar region 6' is arranged in the peripheral area 120 and has an integrated dopant concentration smaller than the integrated dopant concentration of the first p-type pillar regions 6 divided by the number of the first p-type pillar regions 6. The second n-type pillar region 1' has an integrated dopant concentration smaller than the integrated dopant concentration of the first n-type pillar regions 1 divided by the number of the first n-type pillar regions 1. The second n-type pillar region 1' may or may not contribute to the forward current. Accordingly, the gate electrode 12 arranged above the second n-type pillar region 1' is only optional. Depending on its contribution to the forward current, the second n-type pillar region 1' is attributed to the active area 110 and the peripheral area 120, respectively. The body region 5' arranged between the second p-type pillar region 6' and the source metallization 10 does not include a source region or includes a source region which is surrounded by a sufficient amount of p-dopants to inhibit the forming of an electron channel and is therefore arranged in the peripheral area 120. The second n-type pillar region 1' and the second p-type pillar region 6' may also be considered as forming a transitional area or zone between the active area 110 and peripheral area 120.

Due to the reduced doping of the second n-type pillar region 1' and the second p-type pillar region 6' compared to the compensation structure 1, 6, the potential drop across the second n-type pillar region 1' and the second p-type pillar region 6' is also lower during the off-state (blocking mode). Accordingly, any avalanche breakdown is expected to occur in the active area 110 only. Due to the larger area of the active area 110 compared to the peripheral area 120, the semiconductor device 600 tolerates higher avalanche currents and avalanche energies, respectively, without damaging.

For applications with rare or none avalanche events, such as in resonant circuits, the transitional area may be omitted to further reduce the area of the peripheral area 120.

The second n-type pillar region 1' and/or the second p-type pillar region 6' may also include acceptors and donors as the auxiliary pillar regions 16, however with an excess of donors and acceptors, respectively. This may facilitate manufacturing as those structures may be formed with implantation masks having common openings of different width (in x-direction) for the second n-type pillar region 1' and/or the second p-type pillar region 6'. This is explained below in more detail with regard to FIGS. 12 and 13.

In the peripheral area 120, the semiconductor body 40 further includes: a low-doped semiconductor region 2 that adjoins the second p-type pillar region 6' and has a lower maximum doping concentration lower than the second n-type pillar region 1'; and a plurality of auxiliary pillar regions 16 as explained above with regard to the FIGS. 1 to 7. As indicated by the dashed-dotted circles and the dashed circles within the auxiliary pillar regions 16, the auxiliary pillar regions 16 may include sub-regions of higher concentrations of donors and acceptors, respectively, which typically overlap pairwise with each other. This may result in a more favorable electric field distribution during the blocking mode.

The concentration of donors in one or more of the auxiliary pillar regions 16 may vary in vertical direction z and have in the z-direction several first local maxima at respective first depths, and the concentration of acceptors may also vary in the y-direction and have in the z-direction at several local maxima in respective second depths that typically substantially matches the first depths. Alternatively, the first and second depths may be off-set in z-direction.

Likewise, the concentration of donors in the one or more of the auxiliary pillar regions 16 may vary in a horizontal direction x and have a local maximum at a corresponding first horizontal coordinate $x_0$, and the concentration of acceptors in the one or more of the auxiliary pillar regions 16 may vary in the horizontal direction x and have a corresponding maximum at least close to the a first horizontal coordinate $x_0$.

Typically, the semiconductor body 40 of semiconductor device 600 further includes a p-type first edge termination region 17 adjoining the low-doped semiconductor region 2, and an n-type second edge termination region 18. The maximum doping concentration of n-type dopants of the low-doped semiconductor region 2 is typically lower than a maximum doping concentration of the first n-type pillar regions 1 by at least a factor of five, more typically by at least a factor of ten, for example, by a factor of about 50 or of about 100. Due to the low concentration of n-type dopants in the second semiconductor region 2, the contribution of the low-doped semiconductor region 2 to the total output charge $Q_{OSS}$ is very low.

The n-type second edge termination region 18 has a maximum doping concentration higher than the maximum doping concentration of the low-doped semiconductor region 2, adjoins the first edge termination region 17, and is at least partly arranged between the first edge termination region 17 and the first surface 101. Typically, a vertically integrated dopant concentration of the n-type second edge termination region 18 matches or is lower than a vertically integrated dopant concentration of the p-type second edge termination region 17.

The output charge $Q_{OSS}$ of the peripheral area 120 is mainly determined by the n-type second edge termination region 18, the p-type first edge termination region 17 and the second p-type pillar region 6' but significantly lower than for edge-termination structures based on compensated inactive alternating n-type and p-type pillar regions extending into the peripheral area 120. Further, the output charge $Q_{OSS}$ of the peripheral area 120 is typically substantially reduced due to the presence the auxiliary pillar region 16.

In the exemplary embodiment illustrated in FIG. 8, the p-type first edge termination region 17 is in Ohmic contact with the source metallization 10.

In another embodiment, the first edge termination region 17 is a floating semiconductor region. In this embodiment, the semiconductor device 600 is typically designed such that a space charge region expanding from the pn-junction formed between the low-doped semiconductor region 2 and the second p-type pillar region 6' reaches the first edge termination region 17 and the pn-junction formed between the low-doped semiconductor region 2 and the first edge termination region 17, respectively, already at a low reverse voltage of for example at most 5% or 10% of the rated blocking voltage.

The first edge termination region 17 typically acts as a JTE (Junction Termination Extension)-region and is in the following also referred to as JTE-region 17. The p-type dopant concentration in the JTE region 17 may be constant or decreasing continuously or in discrete steps with decreasing distance from the edge 41. The latter is indicated in FIG. 8 by the two portions 17a, 17b of the JTE-region 17. Correspondingly, the n-type dopant concentration in the n-type second edge termination region 18 may be constant or decreasing continuously or in discrete steps with decreasing distance from the edge 41. The latter is indicated in FIG. 8 by the two portions 18a, 18b of the n-type second edge termination region 18. The n-type second edge termination region 18 stabilizes the edge-termination structure against surface charges on the first surface 101 and reduces the injection of holes into the dielectric region 13.

Further and similar as explained above with regard to FIG. 4, an n-type channel-stop region 8 having a higher maximum doping concentration than the adjoining low-doped semiconductor region 2 may be arranged in the low-doped semiconductor region 2 and may extend to the edge 41 for reducing the leakage current. In other embodiments, the channel-stop region 8 may extend in a vertical direction from the first surface 101 to an n-type field-stop region 3 or even to an n-type drain region 4 in ohmic contact with the drain metallization and each having a higher maximum doping concentrations than the low-doped semiconductor region 2.

In the exemplary embodiment illustrated in FIG. 8, the semiconductor device 600 further includes a field plate 12a in Ohmic contact with the gate electrodes 12 and a gate metallization (not shown in FIG. 8), respectively, and a field plate 11a in Ohmic contact with the drain metallization 11. Accordingly, the electric field distribution in the off-state may be further smoothed and/or the sensitivity of the semiconductor device 600 with respect to mobile charges in the dielectric region 13 be further reduced.

The field plate 11a is typically arranged close to the edge 41. The field plate 12a is typically arranged between the field plate 11a and the source metallization 10.

The field plate 11a and/or the field plate 12a may be stepped as illustrated in FIG. 8, i.e., the vertical (minimum) distance of the field plates 11a and/or 12a from the first surface 101 may change substantially stepwise in horizontal direction x. The number of steps may also be higher or lower compared to the exemplary embodiment illustrated in FIG. 8. In other embodiments, only one or even none of the field plate 11a, 12a is arranged on the first surface 101.

Typically, the integrated absolute dopant concentration of the second p-type pillar region 6' is smaller than the integrated absolute dopant concentration of the second n-type pillar region 1', which is smaller than the integrated absolute dopant concentration of the first p-type pillar regions 6 substantially matching the integrated absolute dopant concentration of the first n-type pillar region 1.

Typically, the integrated concentration of p-type dopants in the second p-type pillar region 6' is smaller than the integrated concentration of n-type dopants in the second n-type pillar region 1' by a factor of about 2.

The integrated dopant concentration of the second n-type pillar region 1' is typically in a range from about 50% to about 99% of the integrated dopant concentration of the first n-type pillar region 1.

The integrated dopant concentration of the second p-type pillar region 6' is typically in a range from about 25% to about 60% of the integrated dopant concentration of the first p-type pillar region 6.

In further embodiments, more than one pair of second pillar regions 1', 6' is used, typically with decreasing integrated dopant concentration towards the edge, for example in steps of about 5% from about 98% down to about 10% or even 8%. In further embodiments, the integrated dopant concentrations of the second p-type pillar regions 6' and of the second n-type pillar regions 1' decrease with an increasing distance from the active area 110 in a lateral direction.

According to numerical simulations of the semiconductor device 600 illustrated in FIG. 8, the corrugation of the electric potential in the second p-type pillar region 6' is reduced compared to the first pillar regions 1, 6. Accordingly, avalanche multiplication will occur only in the active area 110 as affirmed by analyzing the corresponding generation of charge carriers. According to the simulations, the horizontal extension of the peripheral area 120 of the semiconductor device 600 could even further be reduced. This would result in an even lower product of $R_{on}$ times $Q_{oss}$.

In the following for manufacturing semiconductor devices with charge compensation structures are explained.

Charge compensation semiconductor devices are mainly produced with a so-called 'multiple epitaxy' process. In this case, an n-doped epitaxial layer, which may be several μm thick, is first grown on a highly n-doped substrate and commonly referred to as 'buffer epi'. In addition to a doping level introduced in the epitaxial step doping ions are introduced into the buffer epi through a photoresist mask using implantation with the doping ions in the first charging locations (for example boron for phosphorous doping). Counter doping can be also employed with implantation (either through a mask, or on the entire surface). However, it is also possible to separate the individual epitaxial layers with the required doping. After that, the entire process is repeated as much time as required until an n (multi-epitaxial) layer is created which has a sufficient thickness and which is equipped with charge centers. The charge centers are mutually adjusted to each other and vertically stacked on top of each other. These centers are then merged with outward thermal diffusion in an undulating, vertical column to form adjacent p-type charge compensation regions (compensation regions) and n-type charge compensation regions (drift portions). The manufacturing of the actual devices can then be conducted at this point.

Another conventional technique for fabricating charge compensation semiconductor devices involves trench etching and compensation with trench filling. The volume which absorbs the voltage is deposited in a single epitaxial step (n-doped epi) on a highly n-doped substrate, so that the thickness corresponds to the total thickness of the multilayered epitaxial structure. After that, a deeper trench is etched, which determines the form of the p-column. This trench is then filled with p-doped epi which is free of crystal defects. However, the integration of doping during an epi process is possible only with relatively large fluctuations. In particular with very small dimensions, the corresponding fluctuations quickly exceed the window provided for the process, which can lead to significant yield losses. Also, a vertical variation of the doping profile (and thus also of the vertical development of the strength of the field) is not possible. It may therefore be difficult to meet various robustness criteria with this technique. For these reasons n-type and p-type dopants of the charge compensation structures are in the following mainly introduced by implanting.

Figure 9:
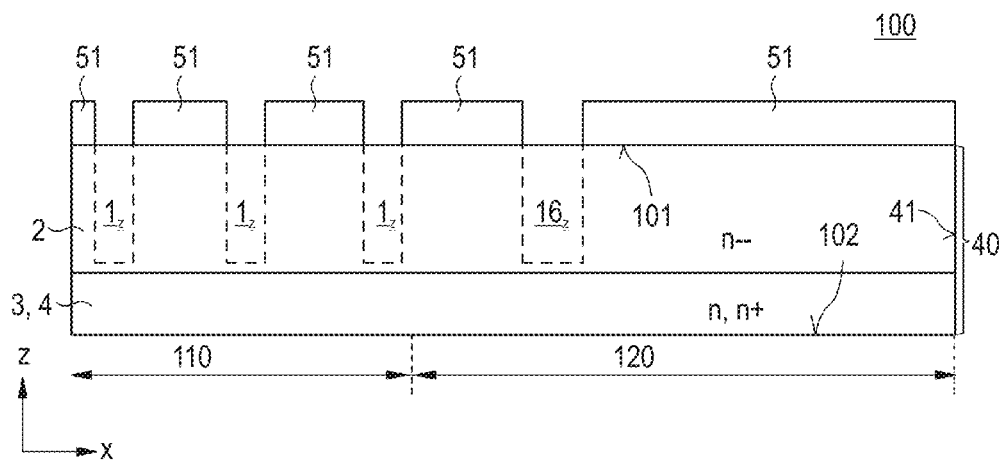
FIGS. 9 to 11 illustrate vertical cross-sections through a semiconductor device during method steps of a method according to embodiments.
Figure 10:
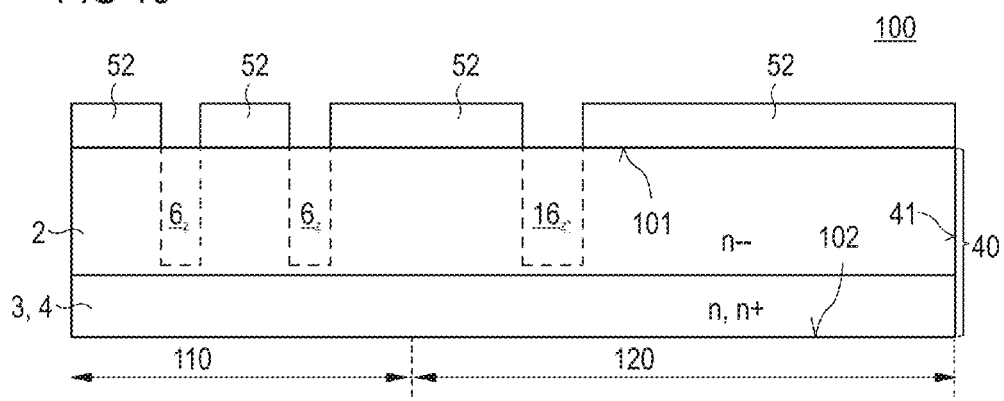
Figure 11:
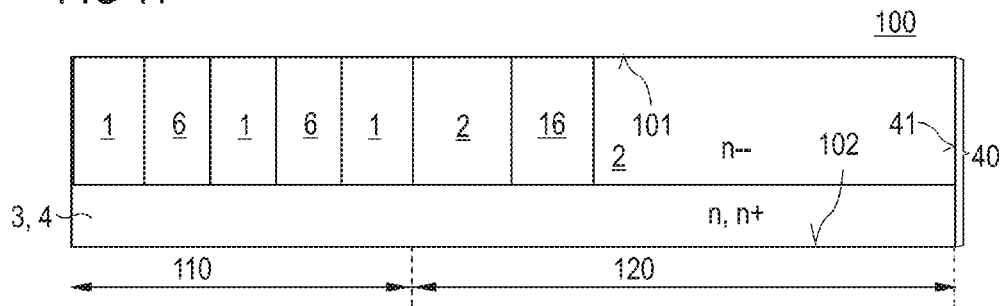

FIGS. 9 to 11 illustrate vertical cross-sections through a semiconductor body 40 of a semiconductor device 100 during method steps.

In a first step a wafer 40 having an upper side 101 typically formed as a flat surface, a lower side 102 typically also formed as a flat surface and semiconductor layer 2 having a first concentration of n-dopants and extending to the upper side 102 is provided. Typically, the wafer 40 includes a highly n-doped substrate 4 extending to the lower side 102 and one or more epitaxial layers 3, 2 formed on the highly n-doped substrate 4. In the device 100 to be manufactured the highly n-doped substrate 4 typically forms drain region 4. The optional semiconductor layer 3 arranged between the highly n-doped substrate 4 and the semiconductor layer 2 typically forms field-stop region 3 of field-stop layer 3 in the device 100 to be manufactured. Forming the field-stop layer 3 may include one or more epitaxial steps and one or more processes of unmasked implanting n-type dopants. The semiconductor layer 2 is typically formed by a single epitaxial deposition. Further, the first concentration of n-dopants of the semiconductor layer 2 is typically lower than about $10^{15}$ cm$^{-3}$, more typically lower than about $5*10^{14}$ cm$^{-3}$ or even lower than about $10^{14}$ cm$^{-3}$, i.e. the semiconductor layer 2 may be a substantially intrinsic semiconductor layer with a doping concentration in a range from about $10^{13}$ cm$^{-3}$ to about $10^{14}$ cm$^{-3}$. Therefore, the semiconductor layer 2 is in the following also referred to as low-doped semiconductor layer 2.

Thereafter, a first mask 51 is formed on the upper side 101. Forming the first mask 51 typically includes depositing a resist on the upper side 101 and photo-lithographically structuring the resist. As illustrated in FIG. 9, the first mask 51 has, in a cross-section substantially orthogonal to the upper side 101 and lower side 102, respectively, first openings in an active area 110 of the semiconductor device 100 to be manufactured and one or more second openings in a peripheral area 120 of the semiconductor device 100. The first openings define in horizontal directions first zones $1z$ in the low-doped semiconductor layer 2 and the one or more second openings define in the horizontal directions one or more second zones $16z$ in the low-doped semiconductor layer 2. Typically, several semiconductor devices 100 are manufactured in parallel on wafer level. FIG. 9 typically corresponds to a right section of one of the several semiconductor devices 100 to be manufactured and finally separated at lateral edges 41, typically by sawing.

Thereafter, donor ions of a first maximum energy are implanted through the first mask 51 into the first zones $1_z$ and the second zone(s) $16_z$.

Thereafter, the first masked 51 may be replaced by a second mask 52 having, in the cross-section, third openings in the active area 110 of the semiconductor device 100 and one or more fourth openings in the peripheral area 120 of the semiconductor device 100. The third openings define in the horizontal directions third zones $6z$ in the low-doped semiconductor layer 2 which typically alternate with the first zones $1z$ in the vertical cross-section. The one or more fourth openings define one or more fourth zone $16z*$ in the low-doped semiconductor layer 2 each of which at least partially overlaps with one of the one or more the second zones $16z$.

Thereafter, acceptor ions having a second maximum energy are implanted through the second mask 52 into the third zone $6_z$ and the fourth zone(s) $16_z$.

In the exemplary embodiment illustrated in FIG. 10, the fourth zone $16_{z*}$ substantially corresponds to the second zone $16_z$ illustrated in FIG. 9. Accordingly, substantially the same amount of acceptor ions and donor ions may be implanted into the common zone $16_z$, $16_{z*}$, formed by the second zone $16_z$ and the fourth zone $16_{z*}$. Accordingly, the effective doping (charge balance) of the remaining low-doped semiconductor portions or regions 2 of the low-doped semiconductor layer 2 may not be changed.

Thereafter, the second mask 52 may be removed.

The order of masked implanting of donor ions and acceptor ions may also be reversed.

Thereafter, a thermal annealing may be used to activate (and diffuse) the acceptor ions and the donor ions in the first zones $1_z$, the third zones $6_z$, the second zone(s) $16_z$ and fourth zone(s) $16_{z*}$. Accordingly, alternating n-type semiconductor regions 1 (drift portions) and p-type semiconductor regions 6 (compensation regions) are formed in the active area 110 and one or more auxiliary pillar region 16 doped both with donors and acceptors are formed in the peripheral area 120. The thermal annealing (temperature step) may be performed as an oven-process. The resulting semiconductor structure is illustrated in FIG. 11.

Due to the common at least partially overlapping second and fourth openings of the two implantation masks 51, 52 in the peripheral area 120, at least the CD-variations of the first and third mask openings for the drift portion 1 and compensation region 6 closest to the edge 41 are reduced. Thus, at least the variation of the charge balance in the outermost semiconductor regions 1, 6 that may cause reduction the breakdown voltage is reduced.

Depending on the geometry of the third and fourth openings, typically the relation of the widths of the openings in a direction (x) substantially orthogonal to the extension direction (y) of strip-shaped openings, the concentration of p-dopants of the auxiliary pillar region(s) 16 may, after thermal annealing, be substantially equal to (for equal widths of the openings), lower than (when the width of the fourth opening is smaller than the width of the third opening) or higher than (when the width of the fourth opening is larger than the width of the third opening) than the doping concentration of p-dopants of the compensation regions 6. Typically, the concentration of p-dopants of the auxiliary pillar region(s) 16 and the concentration of n-dopants of the auxiliary pillar region(s) 16 is higher than the concentration of n-dopants of the auxiliary pillar region(s) 16. Further, the concentration of n-dopants of the auxiliary pillar region(s) 16 may be substantially equal to the concentration of p-dopants of the auxiliary pillar region(s) 16.

According to an embodiment, one or more pairs of further pillar regions (1', 6') with reduced doping concentration compared to the pillar regions 1, 6 may be manufactured in parallel in the active area 110 and between the pillar regions 1, 6 and the auxiliary pillar region(s) 16, respectively. This may be done by additional openings in the first mask 51 and the second mask 52 with smaller widths compared to the first openings and third openings, respectively.

Thereafter, further processes to form a field effect semiconductor device may be performed. This may include: forming in the active area 120 and next to the upper side 101 body regions (5), source regions (15), insulated gate electrodes (12), a source metallization (10) in ohmic contact with the compensation regions 6; forming opposite to the source metallization (10) a drain metallization (11) in ohmic contact with the drift portions 1; and forming one or more edge-termination structures in the peripheral area 120 next to the upper side 101, such as field plates (11a, 12a), the first and second edge termination regions (17, 18) and a channel-stop region (8) (all not shown in FIG. 11).

Depending on the device to be manufactured, in particular on the voltage-class of the semiconductor device to be manufactured, the following process sequence may, typically prior to the thermal annealing, be repeated several times: epitaxial depositing at the upper side 101 a further semiconductor layer 2 having the first concentration of n-dopants and extending to a new upper side of the wafer 40, forming a first mask 51 on the new upper side, implanting donor ions through the first mask 51; replacing the first mask 51 by the second mask 52, implanting acceptor ions through the second mask 52, and removing the second mask 52. Typically, the first masks 51 and the second masks 52 are formed using one respective reticle for each mask. Due to repeated epitaxial deposition and masked implantation, the thickness of the compensation structure 1, 6 may be adjusted in accordance with the desired breakdown voltage. Further, vertical doping profiles of the compensation structure 1, 6 and the auxiliary pillar region(s) 16 may be set, e.g. by varying the implantation dose (time). Accordingly, the robustness of the compensation structure may be improved. For example, the amounts of the doping substances may be varied in the vertical direction such that a peak of the electric field is reached during the blocking mode with about a half of the height of the voltage absorbing volume. This may be achieved by providing an excess of donors in a lower portion of the compensation structure 1, 6 and the auxiliary pillar region(s) 16, respectively, and an excess of acceptors in an upper portion of the compensation structure 1, 6 and the auxiliary pillar region(s) 16, respectively, while the overall amount of donors and acceptors in of the compensation structure 1, 6 and the auxiliary pillar region(s) 16, respectively, may be substantially the same.

In further embodiments donor ions of an energy different to the first maximum energy are implanted through the first mask 51 into the first zones $1_z$ and the second zone(s) $16_z$, and/or acceptor ions of an energy different to the second maximum energy are implanted through the second mask 52 into the third zones $6_z$ and the fourth zone(s) $16_{z*}$. This may facilitate manufacturing, in particular forming the often desired vertical doping profiles.

FIG. 12 illustrates a section of a horizontal cross-section through a semiconductor body 40 after implanting and prior to thermal annealing. FIG. 12 thus also typically reflects the layout (corresponding openings) of the used first mask (51, not shown in FIG. 12) and the layout of the used second mask (52, not shown in FIG. 12). For sake of clarity, only one first zones $1_z$ one only one third zones $6_z$ of the active area 110 are illustrated in FIG. 12. In the section of FIG. 12, the first zones $1_z$, the second zones $16_z$, the third zones $6_z$ and the fourth zones $16_{z*}$ are strip-shaped portions and parallel to each other, i.e. elongated in a common direction (y-direction).

According to an embodiment, the layout of the first mask and the second mask are chosen such that the second zone $16_z$ closest to the active area 110 has a lower extension in x-direction (which is perpendicular to the elongation direction y) than and is arranged in the fourth zone $16_{z*}$ closest to the active area 110. After thermal annealing, a partly compensated auxiliary pillar region having an excess of acceptors is formed next to the active area 110. Accordingly, a smoother transition to the typically fully compensated auxiliary pillar regions formed in the pairwise completely overlapping second zones $16_z$ and fourth zone $16_{z*}$ is provided.

As illustrated in FIG. 13 also showing a section of a horizontal cross-section through a semiconductor body 40 after implanting and prior to thermal annealing. In the exemplary embodiment, several partly compensated auxiliary pillar regions having an excess of donors may be formed next to an outermost third zone $6_z$. This may be achieved by choosing layouts of the first and second masks so that the fourth zones $16_{z*}$ have a smaller extension in x-direction of e.g. about 90% of the second zones $16_z$ and lie within a corresponding second zone $16_z$.

Figure 14:
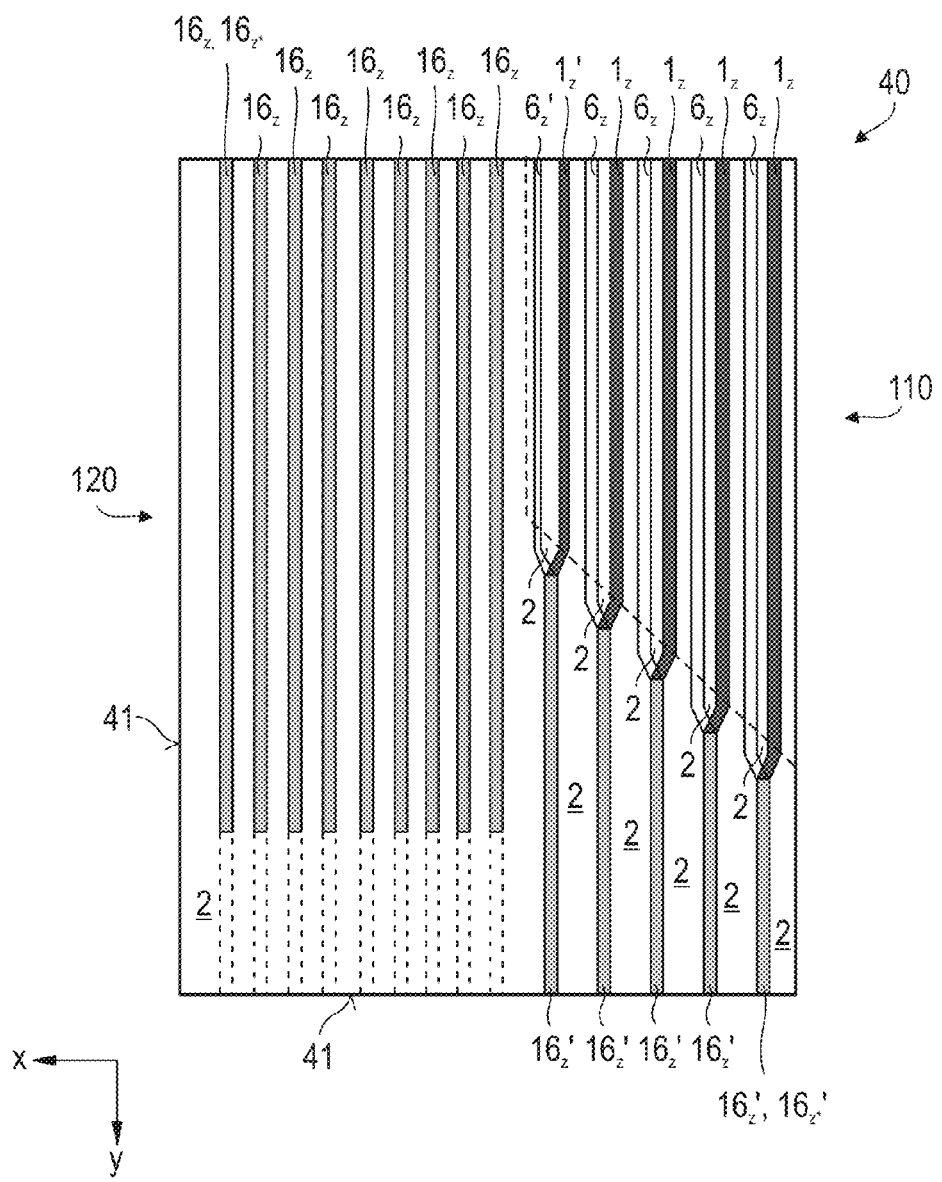
FIG. 14 illustrates a horizontal cross-section through a semiconductor body during method steps of a method according to embodiments.

FIG. 14 illustrates a section of a horizontal cross-section through a semiconductor body 40 after implanting and prior to thermal annealing. FIG. 14 thus also typically reflects the layout (corresponding openings) of the used first mask (51, not shown in FIG. 14) and the layout of the used second mask (52, not shown in FIG. 14).

In the section of FIG. 14, the first zones $1_z$, $1_z'$, the second zones $16_z$, $16_z'$, the third zones $6_z$, $6_z'$, and the fourth zones $16_{z*}$ and $16_{z*}'$ completely overlapping with corresponding second zones $16_z$ and $16_z'$ are at least in major portions strip-shaped and orientated in y-direction. For sake of clarity, only the most right and the most left fourth zones are labelled with reference signs $16_{z*}$ and $16_{z*}'$, respectively. The only exception is a transitional area between the active area 110 and the peripheral area 120 where adjacent pairs of first zones $1_z$ with implanted donors and third zones $6_z$ with implanted acceptors merge into one common zone $16_z'$ (overlapping second and fourth zones $16_z'$, $16_{z*}'$) with implanted donors and acceptors. As indicated by the dashed extensions, the common zones $16_z$ (overlapping second and fourth zones $16_z$, $16_{z*}'$) may extend to the edge 41 or a channel-stop region (not shown in FIG. 14) next the edge 41.

According to an embodiment, the layouts of the first mask and the second mask are chosen such that the first zone $1_z'$ closest to the common zones $16_z'$ and the third zone closest to the common zones $16_z$, have a reduced overall doping concentration of for example about 85% to about 95% and about 40% to about 50% of the overall n-type doping and the overall p-type doping concentration of the other the first zone $1_z$ and third zone $6_z$, respectively. This may be achieved by a corresponding reduction of the width (extension in x-direction) of the first zone $1_z'$ (mask opening) closest to the common zones $16_z'$ and the third zone $6_z'$ closest to the common zones $16_z$, and typically results in a further stabilization of the output charge $Q_{OSS}$ with respect to CD-variations and mask overlay errors.

Figure 15:
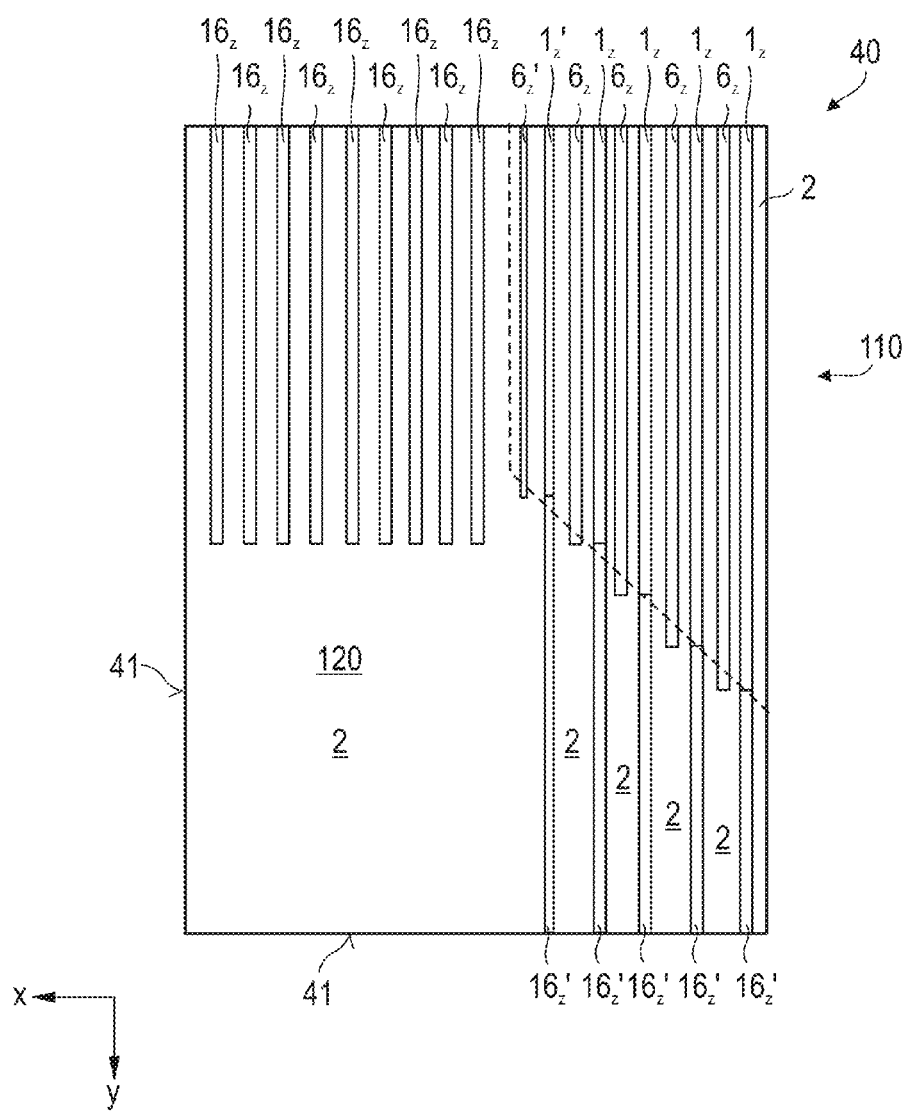
FIG. 15 illustrates a horizontal cross-section through a semiconductor body during method steps of a method according to embodiments.

FIG. 15 illustrates a section of a horizontal cross-section through a semiconductor body 40 after implanting and prior to thermal annealing, and also typically reflects the corresponding layouts of the first mask and the second mask (not shown in FIG. 15).

In the exemplary embodiment, each of the common zones $16_z'$ only merges with one of the first zones $1_z$, $1_z'$.

Figure 16:
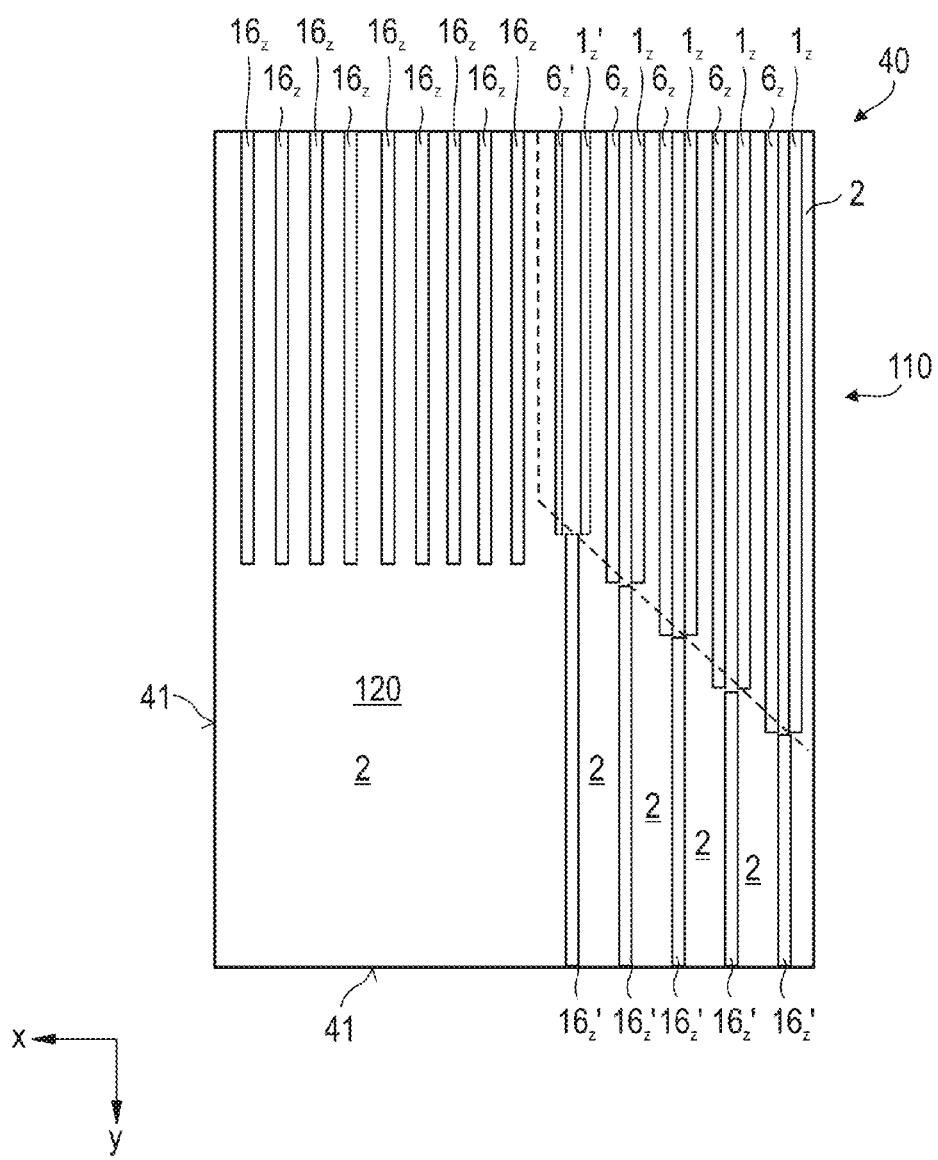
FIG. 16 illustrates a horizontal cross-section through a semiconductor body during method steps of a method according to embodiments.

FIG. 16 illustrates a section of a horizontal cross-section through a semiconductor body 40 after implanting and prior to thermal annealing, and also typically reflects the corresponding layouts of the first mask and the second mask (not shown in FIG. 16).

In the exemplary embodiment, each of the common zones $16_z'$ only comes close to an adjacent pair of the first zone $1_z$, $1_z'$ and the third zone $6_z$, $6_z'$. After thermal annealing, each of the formed auxiliary pillar regions (16') may adjoin one formed n-type pillar region (1, 1') and one formed p-type pillar region (6, 6').

Figure 17:
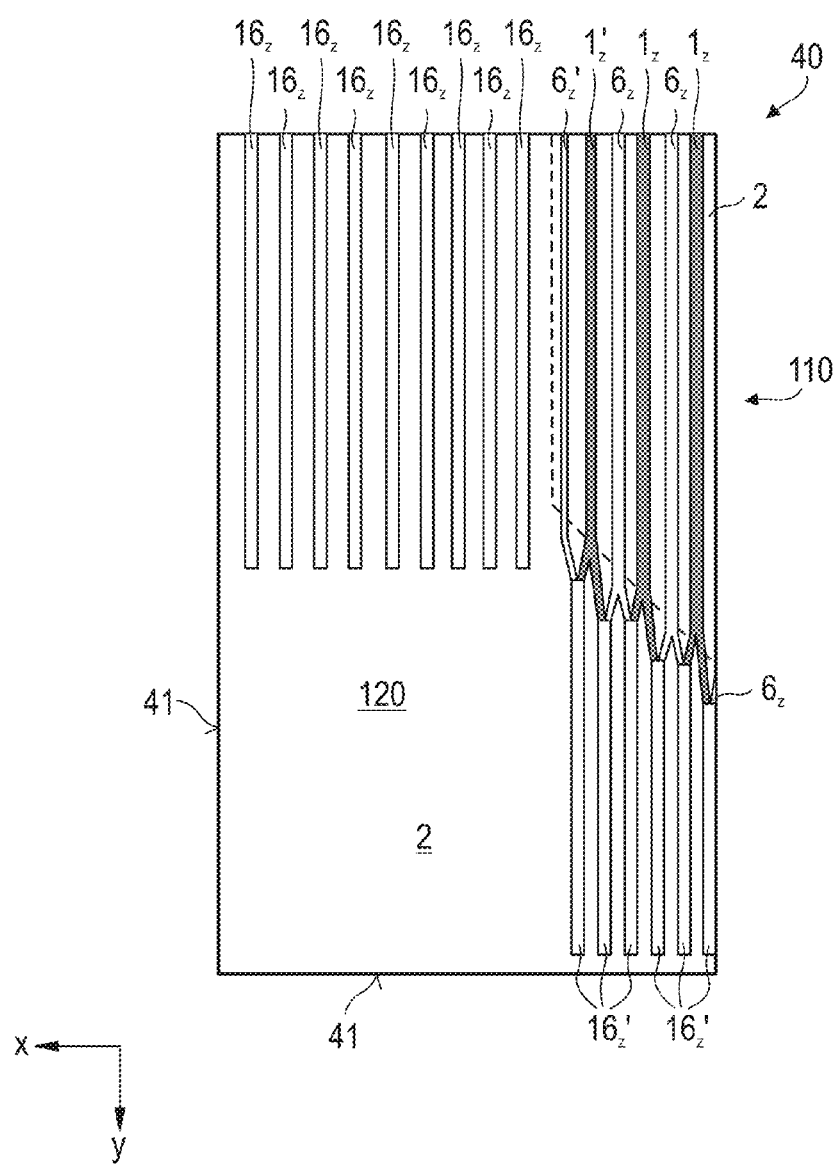
FIG. 17 illustrates a horizontal cross-section through a semiconductor body during method steps of a method according to embodiments.

FIG. 17 illustrates a section of a horizontal cross-section through a semiconductor body 40 after implanting and prior to thermal annealing, and also typically reflects the corresponding layouts of the first mask and the second mask (not shown in FIG. 17).

In the exemplary embodiment, each of the first zones $1_z$, $1_z'$ adjoins two adjacent common zones $16_z'$. For this purpose, each of the first zones $1_z$, $1_z'$ bifurcates into two branches and is substantially y-shaped, respectively, in a transitional area. Further, each of the third zones $6_z$ except for the one ($6_z'$) which is closest to the common zones $16_z$ bifurcates into two branches in the transitional area to adjoin two adjacent common zones $16_z'$.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method for manufacturing a semiconductor device, the method comprising:
   providing a wafer having an upper side and comprising a semiconductor layer having a first concentration of n-dopants;
   forming a first mask on the upper side, the first mask comprising, in a cross-section substantially orthogonal to the upper side, first openings in an active area of a semiconductor device and at least one second opening in a peripheral area of the semiconductor device, the first openings defining first zones in the semiconductor layer and the at least one second opening defining a second zone in the semiconductor layer;
   implanting donor ions of a first maximum energy through the first mask into the first zones and the second zone;
   replacing the first mask by a second mask comprising, in the cross-section, third openings in the active area of the semiconductor device and at least one fourth opening in the peripheral area of the semiconductor device, the at least one fourth opening defining a fourth zone in the semiconductor layer which at least partially overlaps with the second zone, the third openings defining third zones in the semiconductor layer; and
   implanting acceptor ions of a second maximum energy through the second mask into the third zones and the fourth zone.

2. The method of claim 1, wherein a layout of the first mask and a layout of the second mask are chosen such that the first zones, the second zones, the third zones and the fourth zones comprise respective substantially strip-shaped portions which are substantially parallel to each other when seen from above.

3. The method of claim 1, wherein a layout of the first mask and the second mask is chosen such that at least one of the first zones and the third zones merges with at least one of the second zone.

4. The method of claim 1, wherein a layout of the first mask and the second mask is chosen such that the at least one fourth zone substantially corresponds to the at least one second zone when seen from above, and/or wherein the at least one fourth zone is arranged within the at least one second zone when seen from above.

5. The method of claim 1, further comprising:
implanting donor ions of an energy different to the first maximum energy through the first mask into the first zones and the second zone.

6. The method of claim 1, further comprising:
implanting acceptor ions of an energy different to the second maximum energy through the second mask into the third zones and the fourth zone.

7. The method of claim 1, further comprising:
epitaxial depositing of a further semiconductor layer having the first concentration of n-dopants.

8. The method of claim 1, further comprising:
carrying out at least one temperature step to activate donor ions implanted in the first zones and the second zone and to activate acceptor ions implanted in the third zones and the fourth zone.

9. The method of claim 1, further comprising:
forming a source metallization in ohmic contact with p-type semiconductor regions formed in the third zones.

10. The method of claim 1, further comprising:
forming a drain metallization in ohmic contact with n-type semiconductor regions formed in the first zones.

* * * * *